United States Patent
Fujimoto

(10) Patent No.: US 7,248,193 B2
(45) Date of Patent: Jul. 24, 2007

(54) DELTA-SIGMA MODULATOR AND ITS APPLICATION TO SWITCHING AMPLIFICATION CIRCUIT

(75) Inventor: Yoshihisa Fujimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/354,916

(22) Filed: Feb. 16, 2006

(65) Prior Publication Data

US 2006/0187099 A1  Aug. 24, 2006

(30) Foreign Application Priority Data

Feb. 18, 2005  (JP)  ............... 2005-043218

(51) Int. Cl.
*H03M 3/00* (2006.01)

(52) U.S. Cl. .................. 341/143; 330/10; 330/207 A; 330/251; 330/291; 341/118; 341/120

(58) Field of Classification Search ................. 341/143; 330/10, 207 A, 251, 291
See application file for complete search history.

(56) References Cited

U.S. PATENT DOCUMENTS

| | | | |
|---|---|---|---|
| 6,292,122 B1 * | 9/2001 | Younis et al. ................ 341/143 |
| 6,351,184 B1 * | 2/2002 | Miao et al. ............. 330/207 A |
| 6,373,334 B1 * | 4/2002 | Melanson ..................... 330/10 |
| 6,653,960 B2 * | 11/2003 | Mitamura et al. .......... 341/143 |
| 6,924,757 B2 * | 8/2005 | Adams et al. ............... 341/143 |
| 6,970,503 B1 * | 11/2005 | Kalb .......................... 375/238 |
| 6,998,910 B2 * | 2/2006 | Hezar et al. .................. 330/10 |
| 7,038,606 B2 * | 5/2006 | Hongoh et al. ............. 341/143 |
| 7,084,799 B1 * | 8/2006 | Butler ........................ 341/143 |

FOREIGN PATENT DOCUMENTS

JP  11-266157 A  9/1999

OTHER PUBLICATIONS

A Delta-Sigma Modulator for 1-Bit Digital Switching Amplifer, Oct. 3-6, 2004. Pascal Lo Re et al., A1. IEEE 2004 CICC, pp. 177-180.
A Delta-Sigma Modulator for a 1-Bit Digital Switching Amplifier, Y. Fujimoto et al. IEEE Journal of Solid-State Circuits, vol. 40, Nol. 9, Sep. 2005 CICC, pp. 1865-1871.
A Monolithic 20-b Delta-Sigma A/D Converter, Bruce P. Del Signore, et al. IEEE Journal of Solid -State Circuits vol. 25, No. 6, Dec. 1990 CICC, pp. 1311-1317.
12V Σ-Δ Amplifier in 5V CMOS Technology, H. Ballan, et al. IEEE 1995 Custom Integrated Circuits Conference, pp. 559-562.

(Continued)

Primary Examiner—Linh Nguyen
(74) Attorney, Agent, or Firm—Birch, Stewart, Kolasch & Birch, LLP

(57) ABSTRACT

A loop delay control circuit is provided between a comparator and a power switch stage. When the amplitude of an input signal is especially high, the loop delay control circuit secures an oscillation threshold value by setting a delay amount at a low value. On the other hand, when the amplitude of the input signal is not so high, the loop delay control circuit reduces an average switching rate by increasing the delay amount, but does not reduce the oscillation threshold value. This makes it possible to provide a delta-sigma modulator allowing realization of both (i) a high oscillation threshold value, i.e., high output power, and (ii) high power efficiency.

14 Claims, 17 Drawing Sheets

OTHER PUBLICATIONS

A Low-Voltage Fully-Monolithic ΔΣ-Based Audio Amplifier, Jorge Varona, et al. 29th European Solid-State Circuits Conference, Sep. 2003.

Integrated Stereo Delta-Sigma Amplifier, Eric Gaalaas, et al. 2005 IEEE International Solid-State Circuits Conference pp. 120-121.

* cited by examiner

US 7,248,193 B2

DELTA-SIGMA MODULATOR AND ITS APPLICATION TO SWITCHING AMPLIFICATION CIRCUIT

This Nonprovisional application claims priority under 35 U.S.C. § 119(a) on Patent Application No. 043218/2005 filed in Japan on Feb. 18, 2005, the entire contents of which are hereby incorporated by reference.

FIELD OF THE INVENTION

The present invention relates to (i) a delta-sigma ($\Delta\Sigma$) modulator and (ii) a switching amplification circuit using the delta-sigma modulator. Particularly, the present invention relates to an improvement in performance of a modulation circuit controlling a switching element.

BACKGROUND OF THE INVENTION

A switching amplification circuit is known as a class-D amplifier, and allows for high-efficiency amplification of an input signal when used together with a PWM modulation circuit, a synchronous delta-sigma modulation circuit, and an asynchronous delta-sigma modulation circuit. A switching amplification circuit using a delta-sigma modulator is disclosed in Non-patent Document 1 ("A delta-sigma modulator for 1-bit digital switching amplifier", *Proceedings of the IEEE* 2004 *Custom Integrated Circuits Conference*, pp 177-180) and in Non-patent Document 2 ("A delta-sigma modulator for a 1-bit digital switching amplifier", *IEEE Journal of Solid-State Circuits*, Vol. 40, No. 9, September 2005). The use of such a high-order single-loop 1-bit delta-sigma modulator for modulating a signal sent to the switching amplification circuit allows realization of a switching amplification circuit which has a high oscillation threshold value, and which allows for a low distortion, and which has a great dynamic range. Here, as described in page 1865 and FIG. 1 of Non-patent Document 2, the oscillation threshold value refers to the maximum amplitude ratio of (i) the amplitude of a sine wave component contained in a 1-bit output of the switching amplification circuit to (ii) the amplitude of the 1-bit output, when the delta-sigma modulator does not oscillate. The sine wave component corresponds to a sine wave signal which is supplied to the switching amplification circuit and which has a frequency falling within a desired band.

However, for the purpose of realizing high performance, the delta-sigma modulator needs to operate at a sampling frequency sufficiently higher than the desired signal band (e.g., an audio signal band of 0 Hz to 20 kHz). In Non-patent Document 1, the over-sampling ratio (OSR) is 128, and the sampling frequency is 5.6 MHz. The over-sampling ratio refers to a ratio of the sampling frequency to a frequency falling within a band twice wider than the desired signal band.

A delta-sigma modulator similar to the arrangement of Non-patent Document 1 was checked by simulation. As a result, the average switching rate of the delta-sigma modulator was found to range from 2M times/sec to 4M times/sec. Here, the average switching rate refers to a sum of (i) the number of rising edges, per unit time, of a 1-bit output of either the delta-sigma modulator or the switching amplification circuit, and (ii) the number of falling edges, per unit time, of the 1-bit output thereof. An increase in the average switching rate causes a charge current and a through current to proportionately flow through a power switch stage constituting the switching amplification circuit. This causes an increase in power consumption. Therefore, it is difficult for the switching amplification circuit of Non-patent Document 1 to realize high efficiency (high power efficiency) in terms of the electric power.

In order to solve the foregoing problems, a method for reducing the average switching rate has been proposed (e.g., see Japanese Unexamined Patent Publication *Tokukaihei* 11-266157/1999 (published on Sep. 28, 1999; hereinafter, referred to as "Patent Document 1"). FIG. 19 is a block diagram illustrating a switching amplification circuit 101 that operates in accordance with the method. The switching amplification circuit 101 includes a subtracter 102, a loop filter 103, a comparator 104, a pulse width holding circuit 105, and a power switch stage 106.

The subtracter 102 calculates a difference between an input signal X and an output signal V. The input signal X and the output signal V are sent to gain stages $B_1$, respectively. The gain stages $B_1$ multiplies the input signal X and the output signal V by a gain $B_1$. Then, the signals thus multiplied are sent to the subtracter 102. The loop filter 103 includes: seven time-discrete integrators I1 to I7; an adder S, which calculates a sum of respective outputs of the integrators; gain stages $A_1$ to $A_7$; gain stages $C_1$ to $C_6$; and gain stages $G_1$ to $G_3$. The loop filter 103 processes an output of the subtracter 102. The comparator 104 serves as a 1-bit comparator that converts an output signal Y1 of the adder S into a 1-bit signal and that outputs the 1-bit signal as an output signal Y2.

The gain stages $A_1$ to $A_7$ sequentially multiply the outputs of the integrators I1 to I7 by gains $A_1$ to $A_7$, respectively. Then, the gain stages $A_1$ to $A_7$ send the multiplied outputs to the adder S. The gain stages $C_1$ to $C_6$ sequentially multiply the outputs of the integrators I1 to I6 by gains $C_1$ to $C_6$, respectively. The gain stages $G_1$, $G_2$, and $G_3$ sequentially multiply the outputs of the integrators I3, I5, and I7 by gains $G_1$, $G_2$, and $G_3$, respectively. Moreover, the integrator I2 receives a difference between an output of the gain stage $G_1$ and an output of the gain stage $C_1$. The integrator I4 receives a difference between an output of the gain stage $G_2$ and an output of the gain stage $C_3$. The integrator I6 receives a difference between an output of the gain stage $G_3$ and an output of the gain stage $C_5$.

The pulse width holding circuit 105 converts, into a pulse signal having a certain width or greater, the 1-bit signal which is sent from the comparator 104, and which has a minimum pulse width. Then, the pulse width holding circuit 105 outputs the pulse signal as an output signal Y3. The power switch stage 106 amplifies the output signal Y3 supplied from the pulse width holding circuit 105, so as to transmit the output signal V to a load. Further, the power switch stage 106 feeds the output signal V back to the loop filter 103 via the subtracter 102.

The arrangement of FIG. 19 is basically the same as that of Non-patent Document 1, but is different from that of Non-patent Document 1 in that the arrangement of FIG. 19 has the pulse width holding circuit 105 provided between the comparator 104 and the power switch stage 106. The pulse width holding circuit 105 is a circuit for converting, into a 1-bit signal having a minimum pulse width of 2×Ts, the 1-bit signal Y2 which is sent from the comparator 104 and which has a minimum pulse width of Ts.

The arrangement of FIG. 19 makes it possible to reduce the average switching rate by approximately half, as compared with the case where no pulse width holding circuit 105 is provided. However, the reduction in the average switching rate brings about only a minor effect. Further, the use of the pulse width holding circuit 105 inevitably reduces the oscillation threshold value. Accordingly, the following demand arises: the average switching rate should be reduced, but the oscillation threshold value should not be reduced.

As such, the switching amplification circuit described in Patent Document 1 cannot sufficiently reduce the average switching rate. This makes it impossible to realize a switching amplification circuit attaining high power efficiency. Further, even though the average switching rate can be reduced slightly, the oscillation threshold value is accordingly reduced. This inevitably reduces the maximum output power of the switching amplification circuit.

SUMMARY OF THE INVENTION

The present invention has been made in view of the foregoing problems, and has an object to provide: a delta-sigma modulator allowing realization of both (i) a high oscillation threshold value, i.e., high output power, and (ii) high power efficiency; and a switching amplification circuit using the delta-sigma modulator.

In order to attain the foregoing object, a delta-sigma modulator of the present invention includes: a loop filter; a comparator; and one or more loop delay control circuits, each of which is provided in a loop of the delta-sigma modulator, and each of which controls a loop delay amount by which a signal is delayed, each of the loop delay control circuits controlling the loop delay amount in accordance with either (i) a value of the input signal sent to the delta-sigma modulator, or (ii) a value of a signal containing a component of the input signal.

The oscillation threshold value is high when the loop delay amount is small, and gradually decreases as the loop delay amount is increased. Further, the average switching rate is high when the loop delay amount is small, and decreases as the loop delay amount is increased.

According to the foregoing invention, the loop delay control circuit controls the loop delay amount in accordance with either (i) the value of the input signal sent to the delta-sigma modulator, or (ii) the value of the signal containing the component of the input signal. Therefore, when the amplitude of the input signal is especially high, the loop delay amount is set at a low value so that the oscillation threshold value is secured. On the other hand, when the amplitude of the input signal is not so high, the oscillation threshold value is not affected when increasing the loop delay amount to such an extent that the delta-sigma modulator does not oscillate. By taking advantage of this, the average switching rate can be reduced by increasing the loop delay amount. Therefore, the average switching rate can be sufficiently reduced but the oscillation threshold value is not reduced.

This makes it possible to provide a delta-sigma modulator allowing realization of both (i) a high oscillation threshold value, i.e., high output power, and (ii) high power efficiency.

In order to attain the foregoing object, a delta-sigma modulator of the present invention includes: a loop filter; a comparator; and a pulse width control circuit, which is provided in a loop of the delta-sigma modulator, and which controls a minimum pulse width of a signal quantized by the comparator, the pulse width control circuit controlling the minimum pulse width in accordance with either (i) a value of the input signal sent to the delta-sigma modulator, or (ii) a value of a signal containing a component of the input signal.

The oscillation threshold value is high when the minimum pulse width is narrow, and gradually decreases as the minimum pulse width is increased. Further, the average switching rate is high when the minimum pulse width is narrow, and decreases as the minimum pulse width is increased.

According to the foregoing invention, the pulse width control circuit controls the minimum pulse width in accordance with either (i) the value of the input signal sent to the delta-sigma modulator, or (ii) the value of the signal containing the component of the input signal. Therefore, when the amplitude of the input signal is especially high, the minimum pulse width is reduced so that the oscillation threshold value is secured. On the other hand, when the amplitude of the input signal is not so high, the oscillation threshold value is not affected when increasing the minimum pulse width to such an extent that the delta-sigma modulator does not oscillate. By taking advantage of this, the average switching rate can be reduced by increasing the minimum pulse width. Therefore, the average switching rate can be sufficiently reduced but the oscillation threshold value is not reduced.

This makes it possible to provide a delta-sigma modulator allowing realization of both (i) a high oscillation threshold value, i.e., high output power, and (ii) high power efficiency.

In order to attain the foregoing object, a switching amplification circuit of the present invention includes: the delta-sigma modulator of the present invention, the delta-sigma modulator having an output terminal connected to an input terminal of a power switch stage, electric power being supplied from the output terminal of the power switch stage to a load.

According to the foregoing invention, a decrease in the average switching rate of the delta-sigma modulator causes a decrease in the average switching rate of the power switch stage. This makes it possible to realize high power efficiency with which the power switch stage drives the load.

In order to attain the foregoing object, another switching amplification circuit of the present invention includes: the delta-sigma modulator of the present invention, the delta-sigma modulator having a loop including a power switch stage, electric power being supplied from an output terminal of the power switch stage to a load.

According to the foregoing arrangement, a decrease in the average switching rate of the delta-sigma modulator causes a decrease in the average switching rate of the power switch stage. This makes it possible to realize high power efficiency with which the power switch stage drives the load. Further, because noise and distortion each generated from the power switch stage are subjected to shaping together with quantization noise introduced by the comparator, a switching amplification circuit having a high PSRR can be realized.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

One embodiment of the present invention will be described below with reference to FIGS. 1 to 11.

Figure 1:
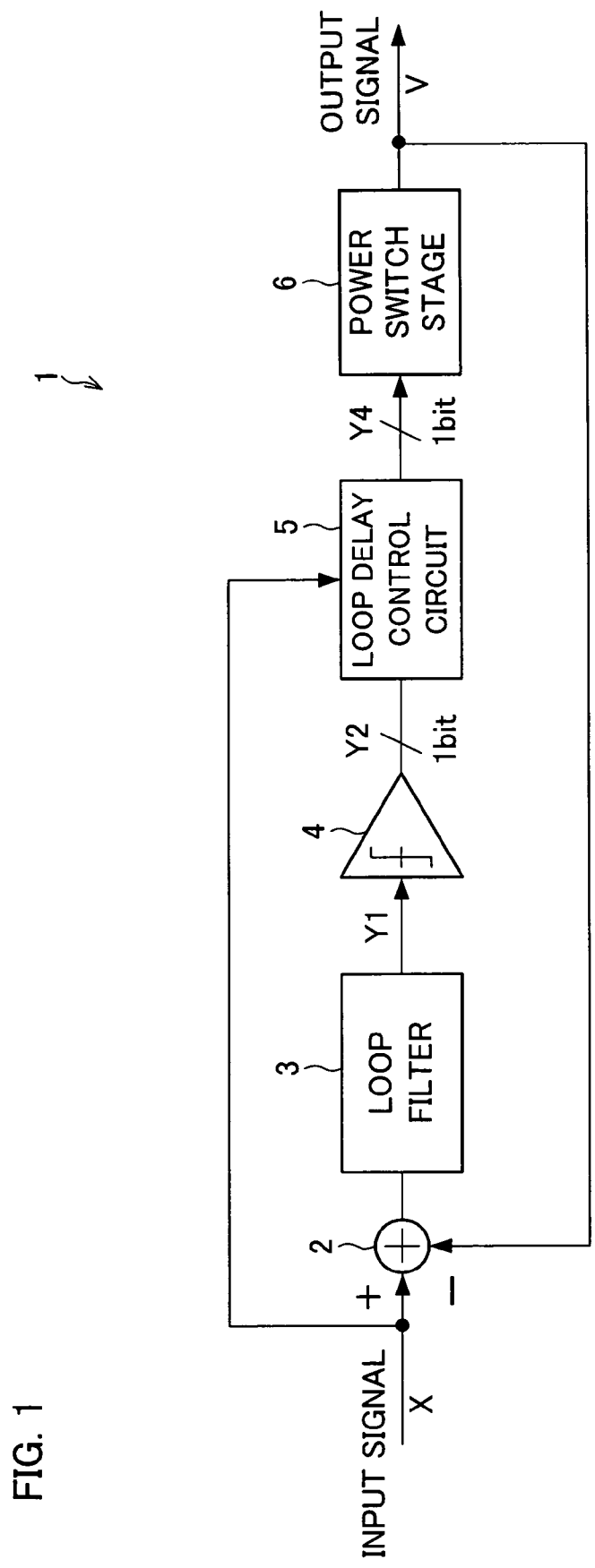
FIG. 1 is a block diagram illustrating an arrangement of a switching amplification circuit according to a first embodiment of the present invention.

FIG. 1 illustrates an arrangement of a switching amplification circuit 1 according to the present embodiment. The switching amplification circuit 1 includes a subtracter 2, a loop filter 3, a comparator 4, a loop delay control circuit 5, and a power switch stage 6. The subtracter 2 calculates a difference between (i) an input signal X supplied to the switching amplification circuit 1 and (ii) an output signal V supplied from the switching amplification circuit 1. The loop filter 3 integrates a signal supplied from the subtracter 2. The comparator 4 converts an output signal Y1 of the loop filter 3 into a 1-bit signal, and outputs the 1-bit signal as an output signal Y2. The loop delay control circuit 5 delays the output signal Y2 of the comparator 4 in accordance with the amplitude of the input signal X, and outputs the delayed signal as an output signal Y4. The power switch stage 6 amplifies the output signal Y4 of the loop delay control circuit 5, and transmits the amplified signal to a load as the output signal V. Further, the output signal V is fed back to the loop filter 3 via the subtracter 2. Further, the comparator 4 is a synchronous comparator that operates in synchronism with an external clock signal.

The loop filter 3 and the comparator 4 constitute a delta-sigma modulator. The delta-sigma modulator, the loop delay control circuit 5, and the power switch stage 6 are provided in a feedback path of the switching amplification circuit 1.

Figure 2:
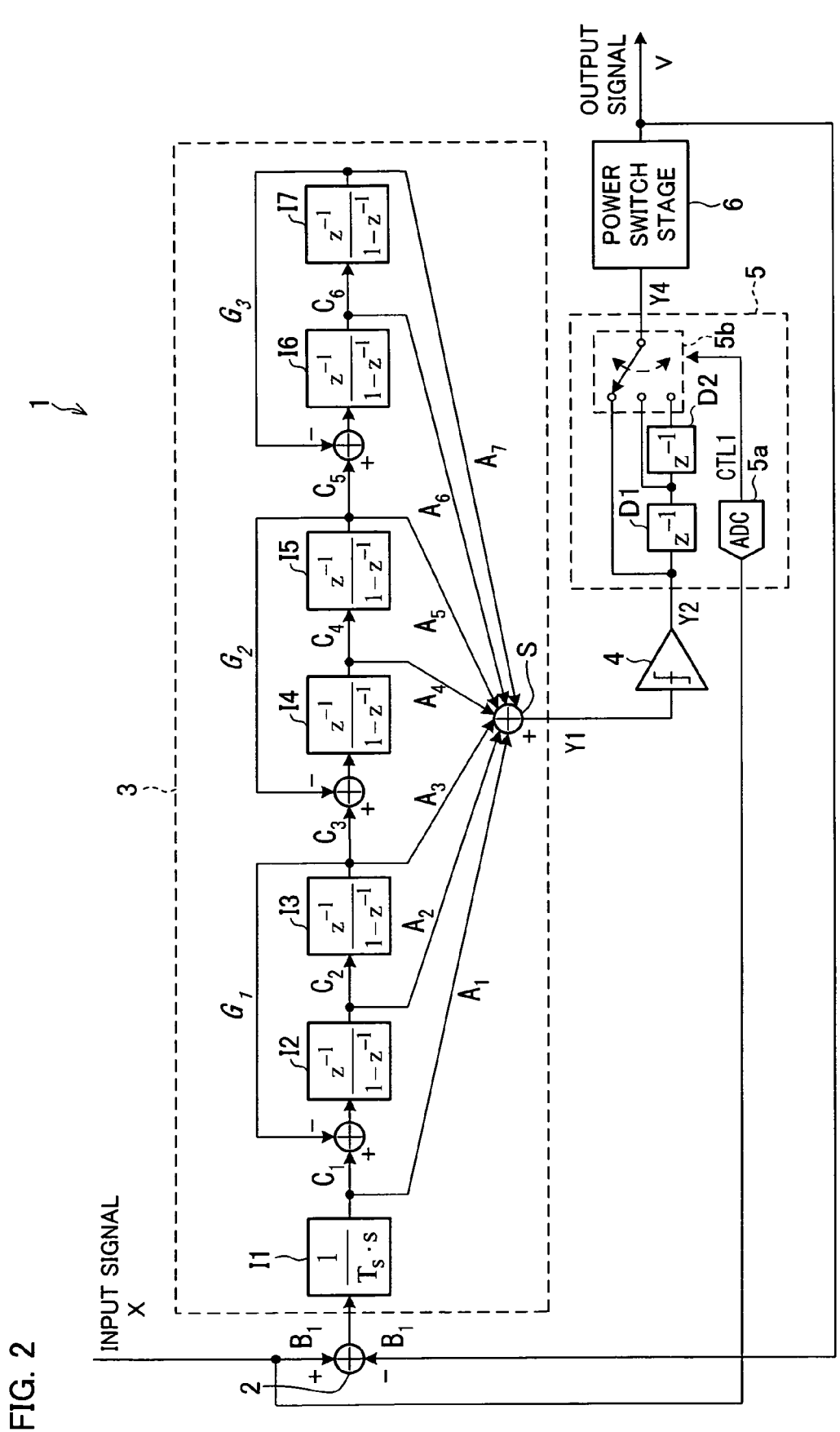
FIG. 2 is a circuit block diagram specifically illustrating respective arrangements of a loop filter and a loop delay control circuit in the switching amplification circuit of FIG. 1.

FIG. 2 is a block diagram specifically illustrating the arrangement of the switching amplification circuit 1.

The subtracter 2 calculates the difference between the input signal X and the output signal V. Before the input signal X and the output signal V are supplied to the subtracter 2, the input signal X and the output signal V has been respectively sent to gain stages B, so as to be multiplied by a gain $B_1$. The loop filter 3 includes: one continuous-time integrator I1; six discrete-time integrators I2 to I7; an adder S, which calculates a sum of respective outputs of the integrators; a plurality of gain stages $A_1$ to $A_7$; a plurality of gain stages $C_1$ to $C_6$; and a plurality of gain stages $G_1$ to $G_3$. The loop filter 3 integrates the output of the subtracter 2.

The gain stages $A_1$ to $A_7$ multiply the outputs of the integrators I1 to I7 respectively by gains $A_1$ to $A_7$, respectively. Then, the gain stages $A_1$ to $A_7$ send the multiplied outputs to the adder S. The gain stages $C_1$ to $C_6$ multiply the outputs of the integrators I1 to I6 by gains $C_1$ to $C_6$, respectively. The gain stages $G_1$, $G_2$, and $G_3$ multiply the outputs of the integrators I3, I5, and I7 by gains $G_1$, $G_2$, and $G_3$, respectively. Moreover, the integrator I2 receives a difference between an output of the gain stage $G_1$ and an output of the gain stage $C_1$. The integrator I4 receives a difference between an output of the gain stage $G_2$ and an output of the gain stage $C_3$. The integrator I6 receives a difference between an output of the gain stage $G_3$ and an output of the gain stage $C_5$.

Further, the loop delay control circuit 5 includes: an A/D (analog-to-digital) converter 5a serving as a quantizer that quantizes the amplitude of the input signal X; a plurality of delay elements D1 and D2; and a loop delay selection circuit 5b. It is assumed here that the input signal X is an analog signal, and that the loop filter 3 is realized using an analog circuit. The delay element D1 and the delay element D2 are serially connected to the output terminal of the comparator 4 in this order, and constitute a delay causing circuit. The delay causing circuit sets three different loop delay amounts (hereinafter abbreviated as "delay amounts") by which the output signal Y2 sent from the comparator 4 is delayed. In accordance with a selection signal CTL1 sent from the A/D converter, the loop delay selection circuit 5b selects one to be connected to an input terminal of the power switch stage 6, among respective output terminals of the comparator 4, the delay element D1, and the delay element D2. In cases where the output terminal of the comparator 4 is selected, the signal sent to the loop delay control circuit 5 (the output signal Y2 sent from the comparator 4) is not delayed, i.e., the delay amount is 0. In this way, the output signal Y4 is outputted. In cases where the output terminal of the delay element D1 is selected, the signal sent to the loop delay control circuit 5 is delayed by a delay amount set in the delay element D1. In this way, the output signal Y4 is outputted. In cases where the output terminal of the delay element D2 is selected, the signal sent to the loop delay control circuit 5 is delayed by a delay amount corresponding to a sum of (i)

the delay amount set in the delay element D1 and (ii) a delay amount set in the delay element D2. In this way, the output signal Y4 is outputted.

As such, the present embodiment uses the three delay amounts encompassing the delay amount of 0. Generally, a plurality of delay amounts may be set. For example, only a single delay element is provided such that two delay amounts are set: (1) a delay amount of 0, and (2) a delay amount set in the delay element. Further, the delay amounts may not encompass the delay amount of 0.

Figure 6:
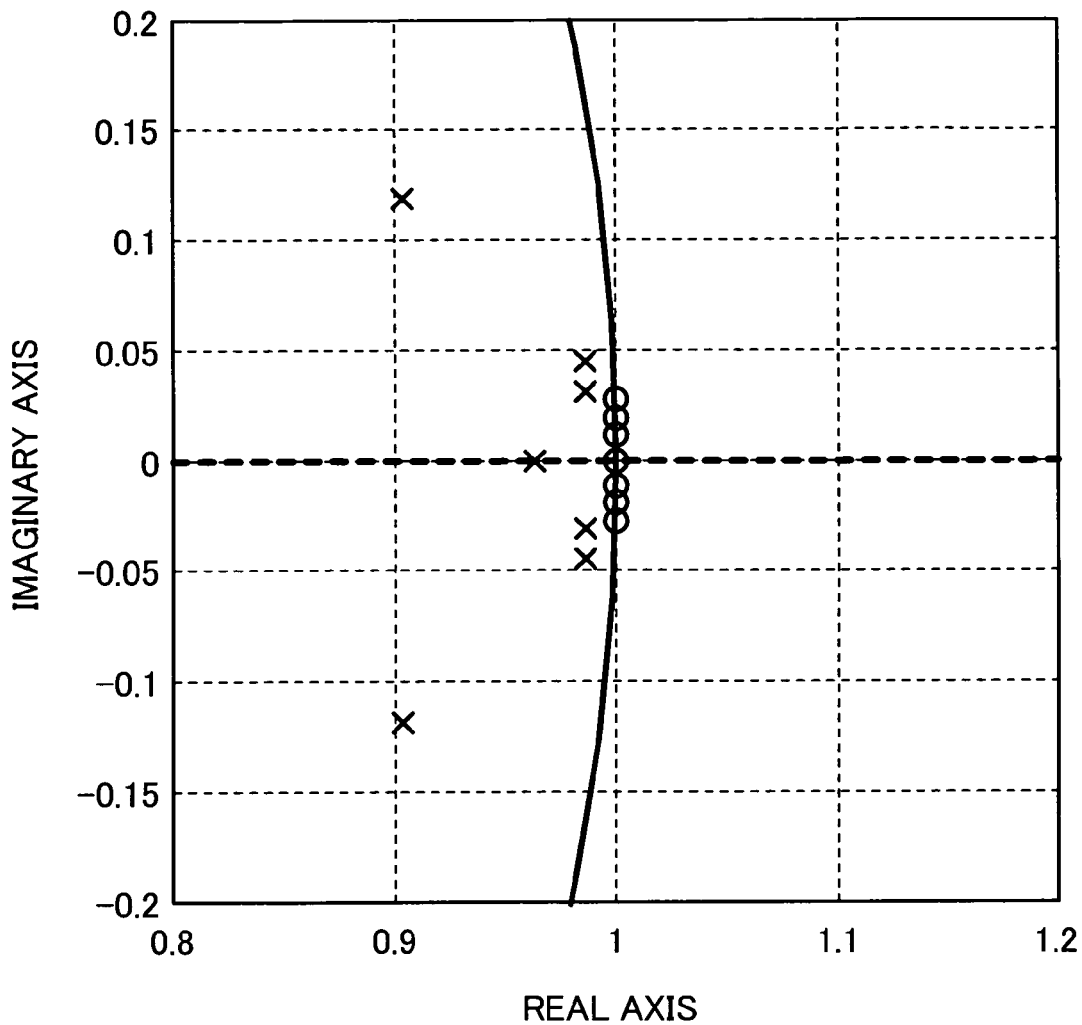
FIG. 6 is a plotting chart showing poles and zero points, each of which indicates a noise transfer function found in accordance with (i) a quantization noise generated by the loop filter and introduced into a delay circuit via a comparator, and (ii) an output signal.
Figure 11:
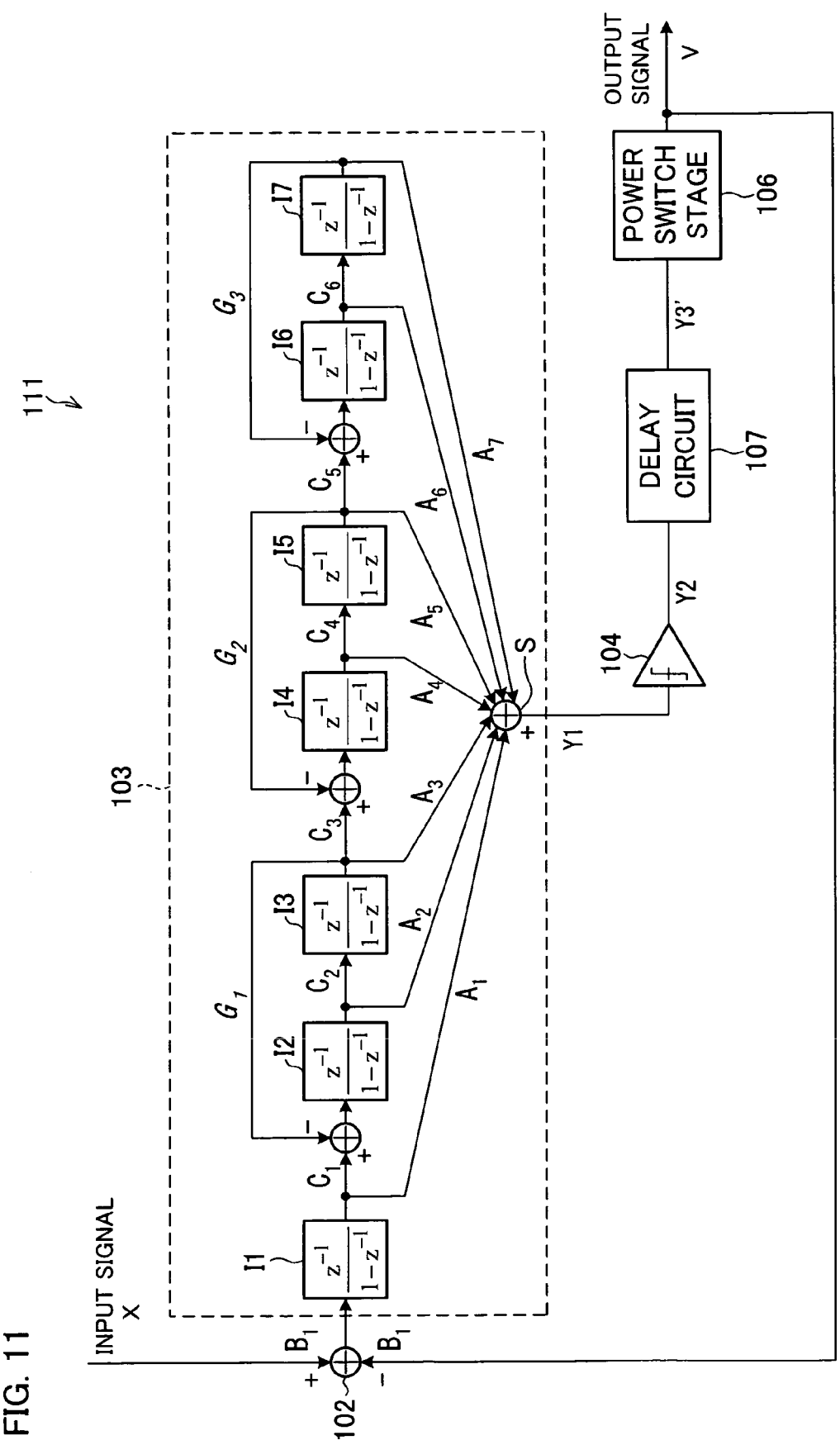
FIG. 11 is a block diagram illustrating an arrangement in which a delay circuit is applied to a conventional switching amplification circuit.

For the purpose of observing how the threshold values of the A/D converter 5a are set and how the relationship between the output signal of the A/D converter 5a and the connection operation of the loop delay selection circuit 5b is determined, see a switching amplification circuit 111 shown in FIG. 11. The switching amplification circuit 111 is obtained by replacing, with a delay circuit 107, the pulse width holding circuit 105 of the conventional amplification circuit 101 shown in FIG. 19. The delay circuit 107 delays, by a certain amount, the output signal Y2 sent from the comparator 104, and outputs the delayed signal as an output signal Y3'. Further, Table 1 below shows coefficients of the loop filter 103. The coefficients were used to obtain the below-mentioned simulation results. FIG. 6 shows poles and zeros of a noise transfer function (NTF) which shows the filtering characteristic (the shaping characteristic) from the quantization noise injected in the comparator 104 to the output signal V. The noise transfer function is found under conditions that the delay circuit 107 and the power switch stage 106 cause no delay, i.e., the delay amounts are 0. In FIG. 6, each of the poles is indicated by "x", and each of the zeros is indicated by "o". Further, Table 2 shows respective values for the poles and the zeros. Further, it is assumed that the desired band ranges from 0 Hz to 20 kHz, and that the sampling frequency fs (=1/Ts, where Ts is a basic operating cycle of the delta-sigma modulator, and is a cycle of the external clock signal) is 5.6 MHz. Further, it is assumed that the output signal V has a signal level of ±1, and that the input signal X has a signal level corresponding to that of the output signal V, i.e., has a signal range of ±1. Further, the below-mentioned simulation results are obtained when the input signal X is a sine wave signal having a frequency of 1 kHz.

TABLE 1

| $A_1$ | 1.20179 | $B_1$ | 0.235739 |
|---|---|---|---|
| $A_2$ | 3.66536 | $C_1$ | 0.05294 |
| $A_3$ | 1.64850 | $C_2$ | 0.15496 |
| $A_4$ | 2.28890 | $C_3$ | 0.03872 |
| $A_5$ | 1.75586 | $C_4$ | 0.03909 |
| $A_6$ | 1.61587 | $C_5$ | 0.02732 |
| $A_7$ | 0.63727 | $C_6$ | 0.02540 |
| $G_1$ | 0.0049808 | $G_3$ | 0.0053520 |
| $G_2$ | 0.0093074 | | |

TABLE 2

| Zeros | Poles |
|---|---|
| 1.0000 | 0.9633 |
| $1.0000 \pm 0.0117i$ | $0.9041 \pm 0.1190i$ |
| $1.0000 \pm 0.0191i$ | $0.9865 \pm 0.0311i$ |
| $1.0000 \pm 0.0278i$ | $0.9862 \pm 0.0447i$ |

Figure 3:
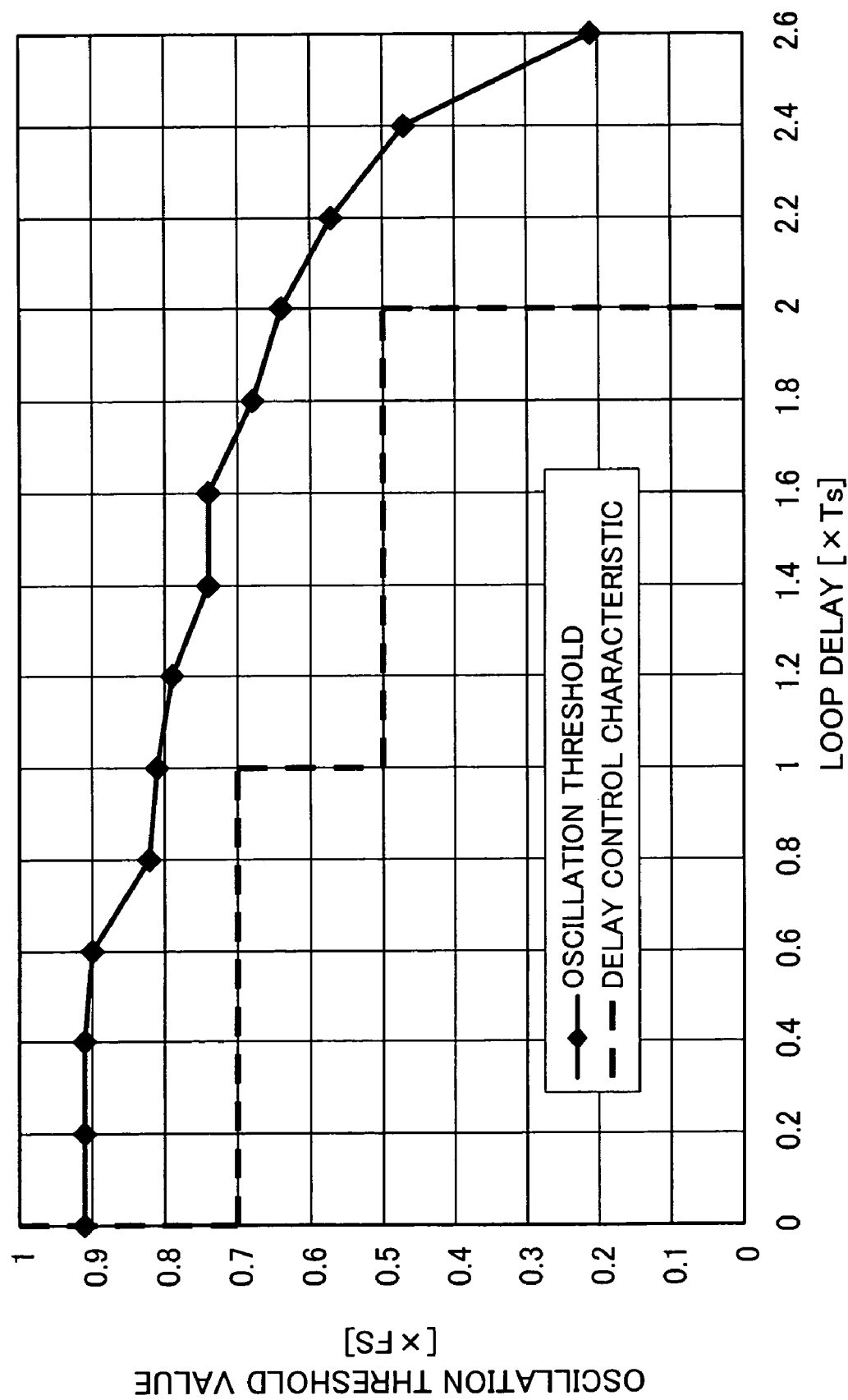
FIG. 3 is a graph showing an oscillation threshold value as a function of a loop delay amount.
Figure 4:
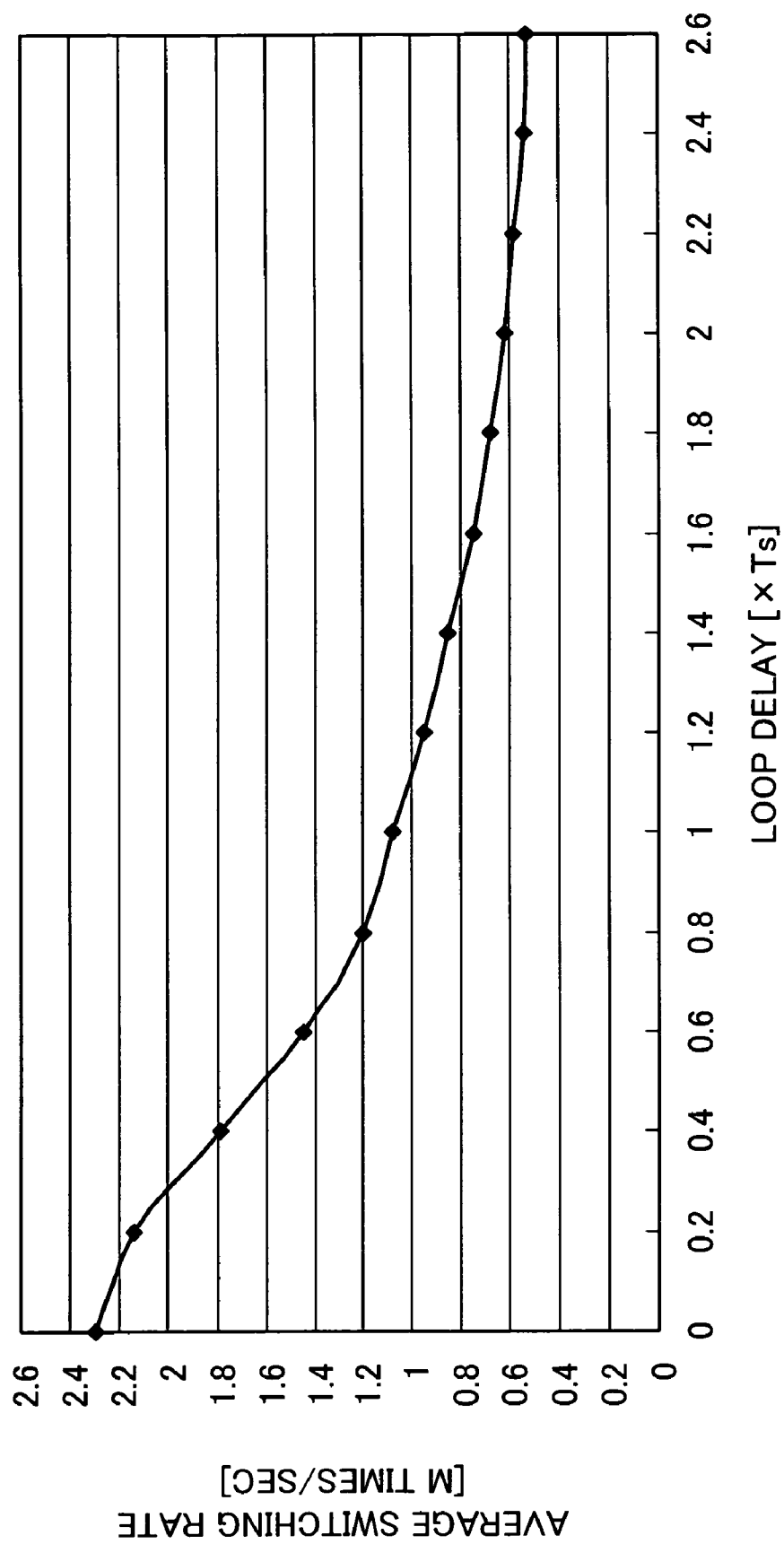
FIG. 4 is a graph showing an average switching rate as a function of the loop delay amount.
Figure 5:
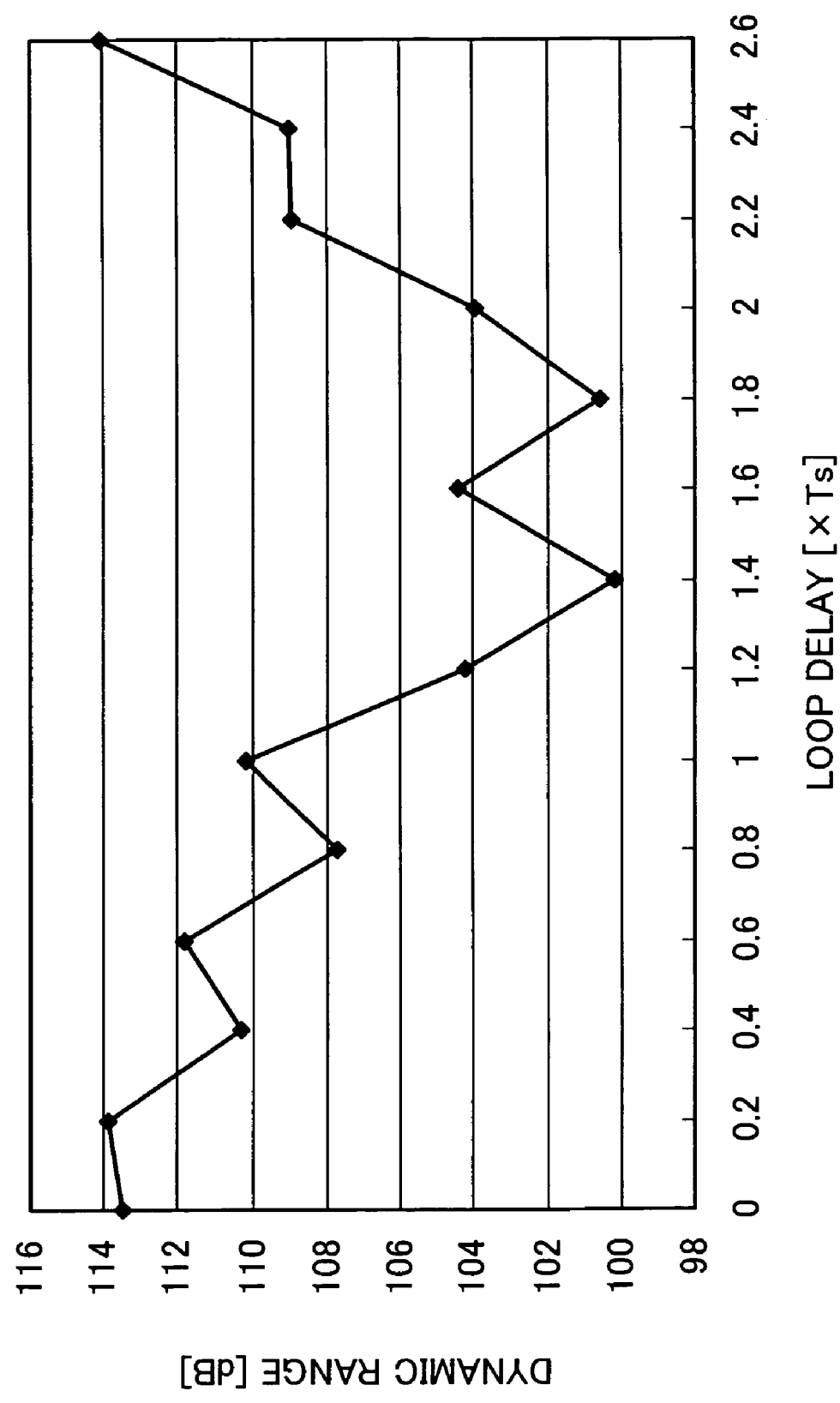
FIG. 5 is a graph showing a dynamic range as a function of the loop delay amount.

It is assumed that each delay amount set in the delay circuit 107 is Ts×D. FIGS. 3 through 5 show the simulation results. Specifically, FIG. 3 shows the oscillation threshold value of the switching amplification circuit 111 shown in FIG. 11, as a function of the loop delay amount (Ts×D). FIG. 4 shows the average switching rate of the switching amplification circuit 111 as a function of the loop delay amount, under conditions that the amplitude of the input signal X is set to the respective oscillation threshold values. FIG. 5 shows the dynamic range characteristic of the switching amplification circuit 111 as a function of the loop delay amount.

In FIG. 3, the solid line indicates the oscillation threshold value obtained by the simulation, and the dotted line indicates a delay control characteristic of the loop delay control circuit 5 described later. FIG. 3 clarifies that: although the oscillation threshold value is high when the loop delay amount is small, the oscillation threshold value gradually decreases as the loop delay amount increases. For example, see a case where D is 1 in FIG. 3. In this case, the delta-sigma modulator operates stably when the amplitude of the input signal X is less than 0.81, and the delta-sigma modulator operates unstably and inevitably oscillates when the amplitude of the input signal X is greater than 0.81. Further, FIG. 4 clarifies that: although the average switching rate is high when the loop delay amount is small, the average switching rate decreases as the loop delay amount increases. (FIG. 4 shows the average switching rate for each loop delay amount, in cases where the amplitude of the input signal X is set to the respective oscillation threshold values.) Further, FIG. 5 clarifies that the dynamic range changes by approximately 15 dB in response to changes in the loop delay amount. (FIG. 5 shows the dynamic range for each loop delay amount, in cases where the amplitude of the input signal X is set to the respective oscillation threshold values.)

These results show that: by controlling the loop delay amount in accordance with the value of the input signal X, the oscillation threshold value corresponds to the oscillation threshold value (0.91 in the example shown in FIG. 3) obtained when the loop delay amount is approximately 0 in FIG. 3. The results also show that the average switching rate is determined greatly depending on an average switching rate found in accordance with large loop delay amounts shown in FIG. 4. This clarifies that it is possible to realize a switching amplification circuit which (i) does not reduce the oscillation threshold value, (ii) has a low average switching rate, and (iii) is free from a great deterioration in the dynamic range, as compared with the conventional switching amplification circuit. In light of this, as shown in FIGS. 1 and 2, the present embodiment includes the loop delay control circuit 5.

The loop delay control circuit 5 controls, in accordance with the input signal X, the delay amount by which the output signal Y2 sent from the comparator 4 is delayed. Therefore, when the absolute value of the input signal X is especially high, the loop delay amount is set at a low value so that the oscillation threshold value is secured. On the other hand, when the absolute value of the input signal X is not so high, the oscillation threshold value is not affected when increasing the loop delay amount to such an extent that the delta-sigma modulator does not oscillate. By taking advantage of this, the average switching rate can be reduced by increasing the loop delay amount. Therefore, the average switching rate can be sufficiently reduced but the oscillation threshold value is not reduced. Such a delta-sigma modulator and the switching amplification circuit 1 make it possible to realize both (i) such a high oscillation threshold value, i.e., high output power, and (ii) high power efficiency.

The following fully explains the operation of the loop delay control mechanism in accordance with the input signal X. For example, as indicated by the dotted line of FIG. 3, the delay amount is so controlled as to be 0 (D=0) in cases where the input signal X falls within a range of −1 to −0.7 or 0.7 to 1. (The delta-sigma modulator oscillates when the input signal X is either (i) not less than 0.91 or (ii) not more than −0.91. Therefore, generally, a limit circuit or the like needs to be provided in the preceding stage of the delta-sigma modulator.) The delay amount is so controlled as to be 1 (D=1) in cases where the input signal X falls within a range of −0.7 to −0.5 or 0.5 to 0.7. The delay amount is so controlled as to be 2 (D=2) in cases where the input signal X falls within a range of −0.5 to 0.5.

Figure 7:
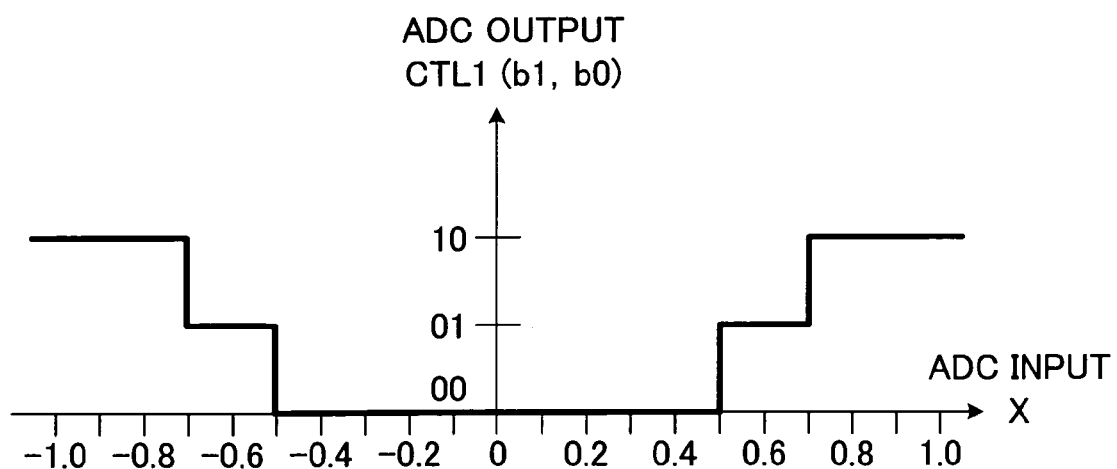
FIG. 7 is a graph showing the relationship between (i) an input of an A/D converter of the loop delay control circuit of FIG. 2, and (ii) an output thereof.

In order to carry out such control, the loop delay control circuit 5 includes (i) the A/D converter 5a for quantizing the input signal X, and (ii) the loop delay selection circuit 5b, as described above with reference to FIG. 2. The delay characteristic can be realized by setting an input-output characteristic of the A/D converter 5a as shown in FIG. 7. In cases where the input signal X falls within a range of −1 to −0.7 or 0.7 to 1, the A/D converter 5a outputs the selection signal CTL1 indicative of 10. In cases where the input signal X falls within a range of −0.7 to −0.5 or 0.5 to 0.7, the A/D converter 5a outputs the selection signal CTL1 indicative of 01. In cases where the input signal X falls within a range of −0.5 to 0.5, the A/D converter 5a outputs the selection signal CTL1 indicative of 00. Moreover, on receipt of the selection signal CTL1 indicative of 00, the loop delay selection circuit 5b selects the output of the delay element D2 such that the output of the delay element D2 is sent to the power switch stage 6. On receipt of the selection signal CTL1 indicative of 01, the loop delay selection circuit 5b selects the output of the delay element D1 such that the output of the delay element D1 is sent to the power switch stage 6. On receipt of the selection signal CTL1 indicative of 10, the loop delay selection circuit 5b selects the output of the comparator 4 such that the output of the comparator 4 is sent to the power switch stage 6. In this way, the delay amount is controlled. Each of these output values of 10, 01, and 00 corresponds to a 2-bit signal (b1, b0) described later.

Figure 8:
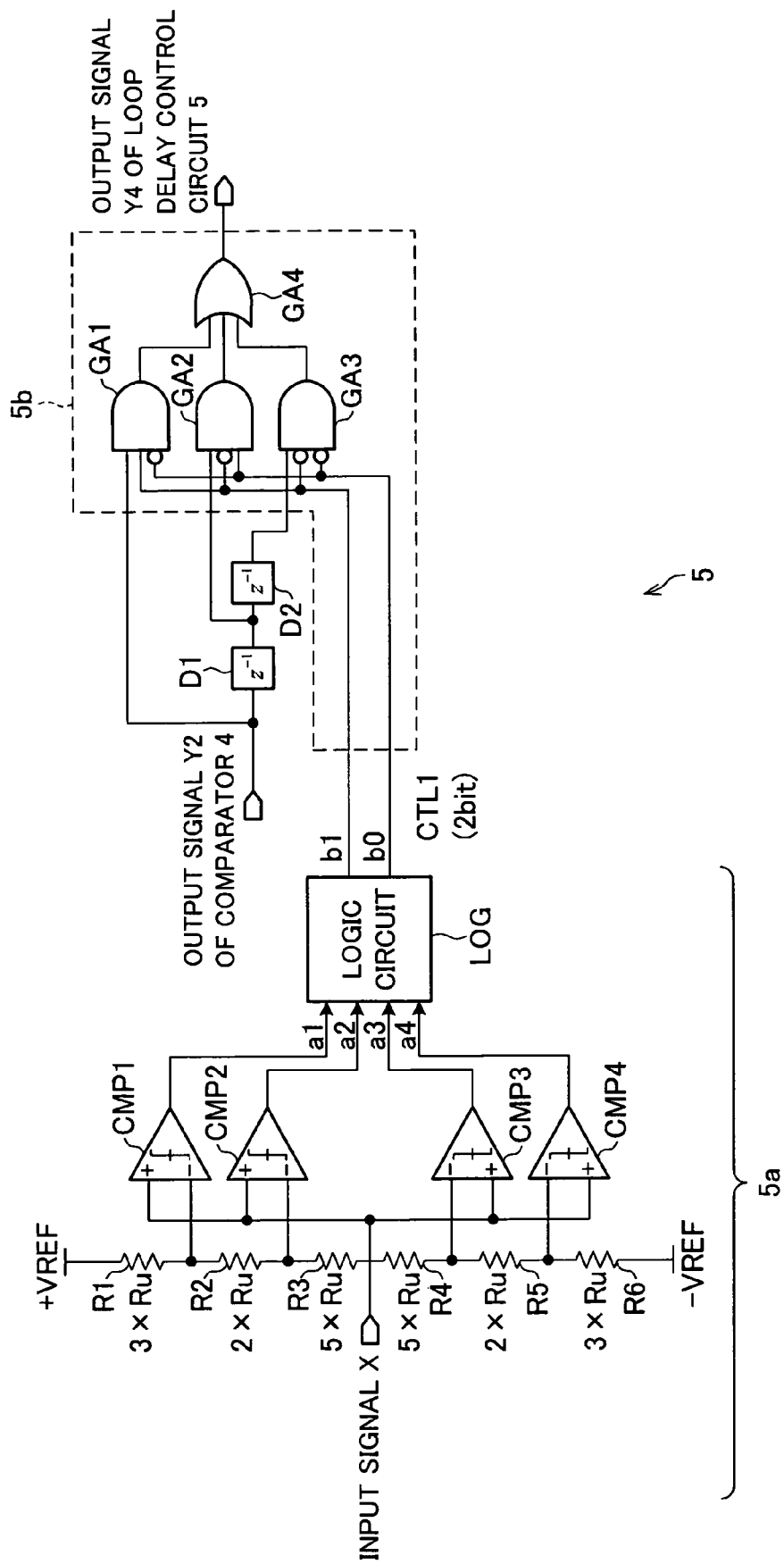
FIG. 8 is a circuit block diagram specifically illustrating respective arrangements of the A/D converter and a loop delay selection circuit in the loop delay control circuit of FIG. 2.
Figure 9:
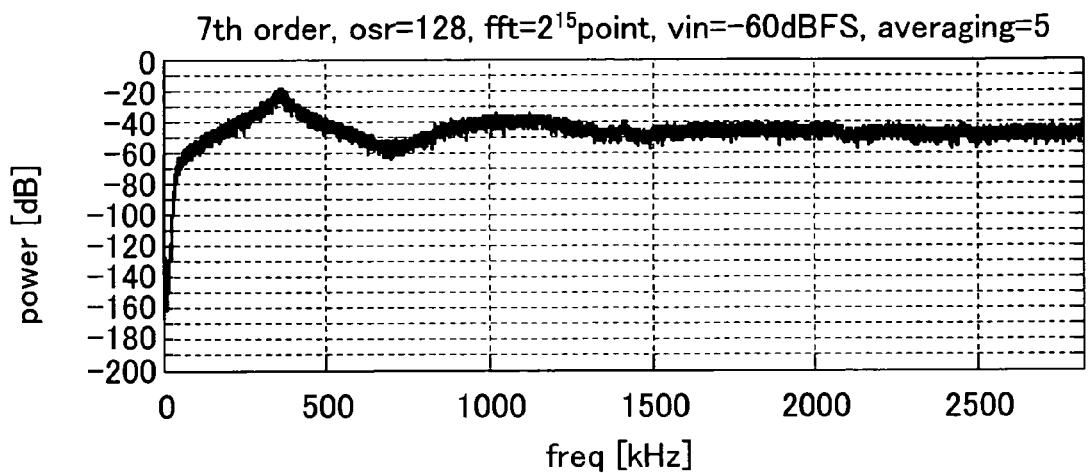
FIGS. 9(a) through 9(c) are graphs each showing a spectrum of an output signal generated when the switching amplification circuit of FIG. 1 is used.
Figure 9:
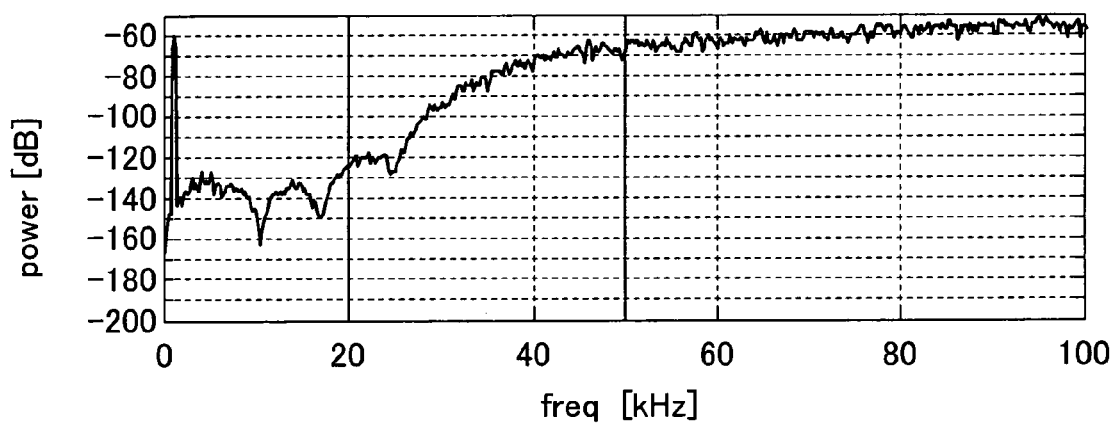
Figure 9:
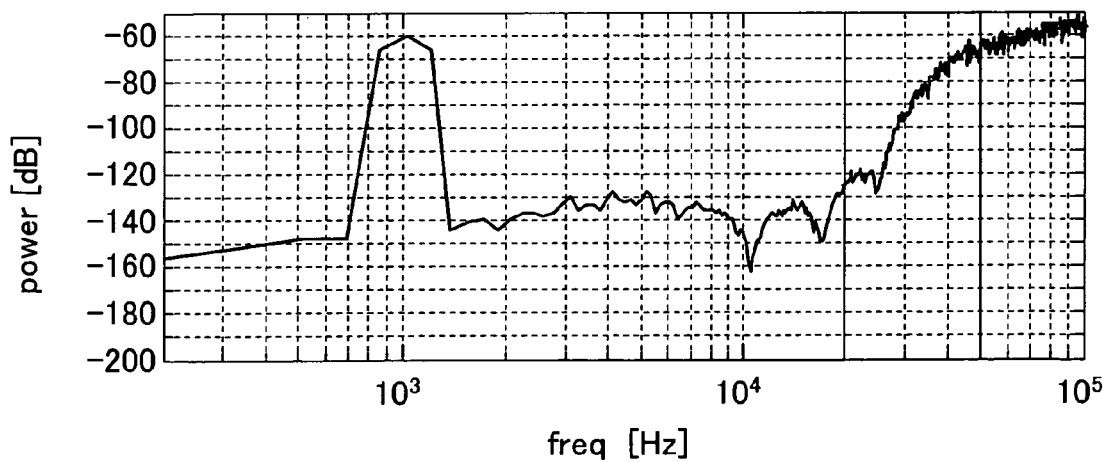
Figure 10:
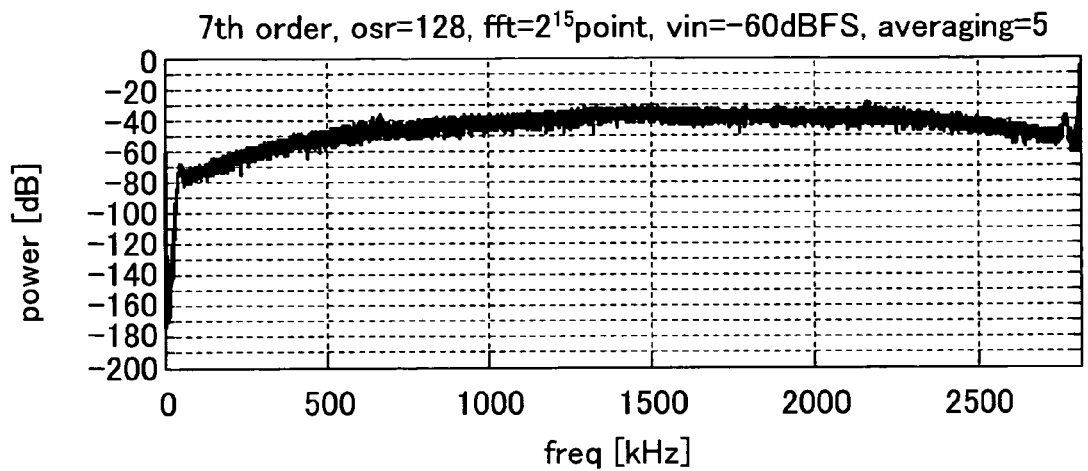
FIGS. 10(a) through 10(c) are graphs each showing a spectrum of an output signal generated when a switching amplification circuit of FIG. 11 is used.
Figure 10:
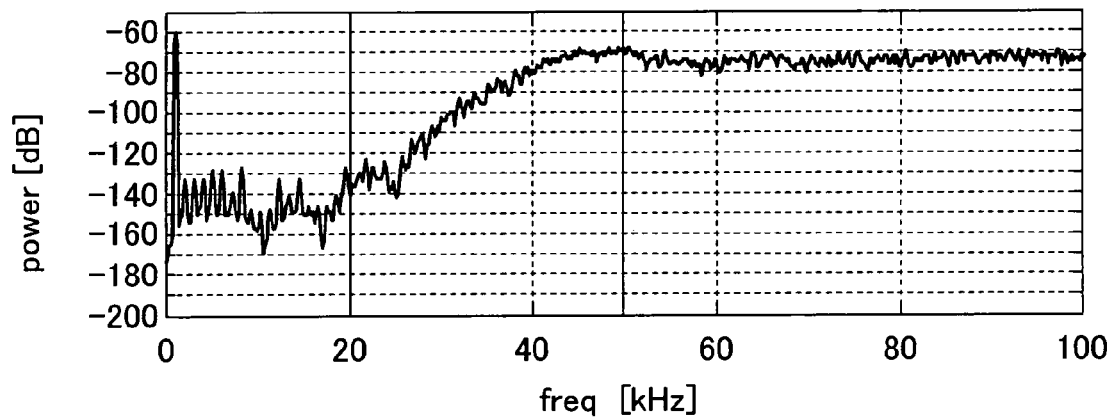
Figure 10:
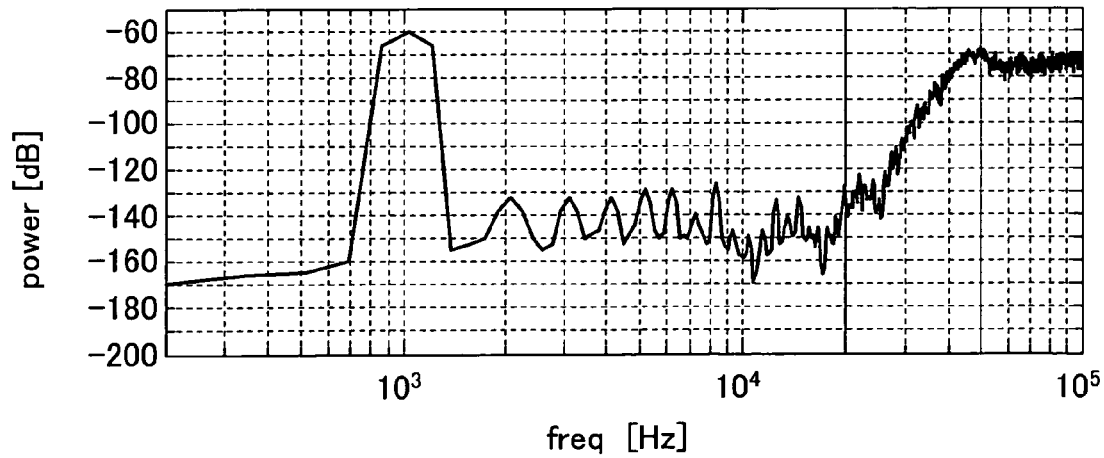

FIG. 8 specifically illustrates respective arrangements of the A/D converter 5a and the loop delay selection circuit 5b. The A/D converter 5a includes: six resistors R1 to R6; four comparator CMP1 to CMP4, each of which is a 1-bit comparator; and a logic circuit LOG, which converts respective outputs of the comparators CMP1 through CMP4 into the selection signal CTL1. Further, the loop delay control circuit 5b includes four logic gates GA1 to GA4.

In the A/D converter 5a, the resistors R1 to R6 are serially connected in this order from a positive power supply +VREF (=+1) toward a negative power supply −VREF (=−1). The resistors R1 to R6 have resistances of 3×Ru, 2×Ru, 5×Ru, 5×Ru, 2×Ru, and 3×Ru, respectively. The comparators CMP1 to CMP4 are synchronous comparators that operate in synchronism with the external clock signal. The input signal X is sent to respective non-inverting input terminals of the comparators CMP1 to CMP4. A node between the resistor R1 and the resistor R2 is connected to an inverting input terminal of the comparator CMP1. A node between the resistor R2 and the resistor R3 is connected to an inverting input terminal of the comparator CMP2. A node between the resistor R4 and the resistor R5 is connected to an inverting input terminal of the comparator CMP3. A node between the resistor R5 and the resistor R6 is connected to an inverting input terminal of the comparator CMP4.

The comparators CMP1 to CMP4 respectively sends signals a1 to a4 to the logic circuit LOG. In other words, the signals a1 to a4 are collectively supplied thereto as a 4-bit signal. The logic circuit LOG outputs a 2-bit signal (b1, b0) consisting of bits b0 and b1. Table 3 shows an input-output characteristic of the logic circuit LOG.

TABLE 3

| a1 | a2 | a3 | a4 | b1 | b0 |
|----|----|----|----|----|----|
| 1  | 1  | 1  | 1  | 1  | 0  |
| 0  | 1  | 1  | 1  | 0  | 1  |
| 0  | 0  | 1  | 1  | 0  | 0  |
| 0  | 0  | 0  | 1  | 0  | 1  |
| 0  | 0  | 0  | 0  | 1  | 0  |

In the loop delay selection circuit 5b, the logic gates GA1 to GA3 are AND gates, and the logic gate GA4 is an OR gate. The logic circuit GA1 calculates the logical product of the output signal Y2 of the comparator 4, the bit b1, and an inversion bit of the bit b0. The logic gate GA2 calculates the logical product of the output signal of the delay element D1, an inversion bit of the bit b1, and the bit b0. The logic gate GA3 calculates the logical product of the output signal of the delay element D2, the inversion bit of the bit b1, and the inversion bit of the bit b0. The logic gate GA4 calculates the logical sum of respective output signals of the logic gates GA1 to GA3, and outputs, as the output signal Y4 of the loop delay control circuit 5, a signal indicative of the logical sum.

As such, the loop delay control circuit 5 described above can be realized with ease.

Table 4 shows the average switching rate and the input signal amplitude dependence characteristic of SNDR (Signal/Noise+Distortion Ratio) (the simulation results), each of which is obtained when the arrangement of FIG. 8 was used (CASE 1). Table 5 shows the average switching rate and the input signal amplitude dependence characteristic of SNDR (Signal/Noise+Distortion Ratio) (the simulation results), each of which is obtained when the arrangement of FIG. 11 was used and when the delay amount is set at 0 (CASE 2). Further, the oscillation threshold value is 0.91 in both CASE 1 and CASE 2. The dynamic range (DR) is 115.93 dB in CASE 1, and is 121.2 dB in CASE 2. Further, in the simulations of both CASE 1 and CASE 2, the values shown in Table 1 were assigned respectively to the gains of the gain stages of the loop filter 3, and the delay amount caused by the power switch stage 6 or 106 was 0.2×Ts. Further, the input signal X took the form of a sine wave having a frequency of 1 kHz, and each of the values shown in Tables 4 and 5 was assigned to the amplitude of the input signal X.

TABLE 4

| Input amplitude [×FS] | Average switching rate [×M times/second] | SNDR [dB] |
|---|---|---|
| 0.001 | 0.7249 | 55.1 |
| 0.1 | 0.7084 | 95.2 |
| 0.2 | 0.7028 | 100.4 |
| 0.4 | 0.6546 | 105.0 |
| 0.6 | 0.7381 | 97.3 |
| 0.8 | 0.9245 | 96.4 |
| 0.9 | 0.8198 | 98.1 |

TABLE 5

| Input amplitude [×FS] | Average switching rate [×M times/second] | SNDR [dB] |
| --- | --- | --- |
| 0.001 | 4.2124 | 50.4 |
| 0.1 | 3.9735 | 102.7 |
| 0.2 | 3.8209 | 109.4 |
| 0.4 | 3.7629 | 112.9 |
| 0.6 | 3.1617 | 113.9 |
| 0.8 | 2.5270 | 113.8 |
| 0.9 | 2.1751 | 110.7 |

These results show that the arrangement of FIG. 8 is slightly inferior to the arrangement of FIG. 11 in terms of both the distortion characteristic and the dynamic range, but has the average switching rate approximately 6 times lower than that of the arrangement of FIG. 11. The deterioration in both the distortion characteristic and the dynamic range can be inhibited by changing the loop delay control characteristic (indicated by the dotted line) of FIG. 3. For example, the deterioration is inhibited by reducing (i) the threshold values (0.7, 0.5) for realizing the delay control characteristic, and (ii) the corresponding delay amounts (D=0, 1, 2). Alternatively, a larger number of threshold values are set in the A/D converter 5a so that the delay amount is controlled more finely. This makes it possible to improve the performance. However, in this case, the arrangement of the loop delay control circuit 5 becomes complicated.

Further, each of FIGS. 9(a) through 9(c) shows a spectrum of the output signal V obtained when the amplitude of the input signal X is 0.001 in CASE 1. Each of FIGS. 10(a) through 10(c) shows a spectrum of the output signal V obtained when the amplitude of the input signal X is 0.001 in CASE 2. The horizontal axis represents the frequency, and the vertical axis represents the output signal power normalized in accordance with a signal power having amplitude of ±1. Each of FIGS. 9(a) and 10(a) shows a characteristic in a frequency range of DC to 2.8 MHz, which is the half of the sampling frequency. In each of FIGS. 9(b) and 10(b), a frequency range of DC to 100 kHz is magnified. In each of FIGS. 9(c) and 10(c), the horizontal axis of each of FIGS. 9(b) and 10(b) is indicated on a log scale. In each of FIGS. 9(b), 10(b), 9(c), and 10(c), two solid lines are drawn in parallel to the vertical axis so as to respectively indicate frequencies of 20 kHz and 50 kHz. A comparison between FIGS. 9(a) through 9(c) and FIGS. 10(a) through 10(c) shows that similar noise-shaping characteristics are obtained in both CASE 1 and CASE 2.

For the purpose of simplifying the circuitry, the four values (±0.5, ±0.7) are chosen as the threshold values of the A/D converter 5a in the above example. However, a larger number of threshold values may be used so that the delay amount is controlled more finely. Further, a circuit for calculating an absolute value may be provided in front of the A/D converter 5a such that two values (+0.5, +0.7) are used as the threshold values of the A/D converter 5a. Further, the above example assumes that the delay amount is an integral multiple of Ts. However, the delay amount may be an integral multiple of Ts/2, or may be changed continuously. Alternatively, a plurality of inverters may be serially connected so that the delay amount is controlled more finely. Here, consider a case where the delay amount is an integral multiple of Ts/2. In cases where the duty ratio of (i) a pulse width between a rising edge and a falling edge of the external clock signal sent to the comparator 4 to (ii) a pulse width between the falling edge and the next rising edge is 50:50, the use of the external clock signal makes it possible to easily carry out such a setting that the delay amount is an integral multiple of Ts/2. Whether the delay amount is an integral multiple of Ts or Ts/2, the signal can be delayed in accordance with an operation of the delta-sigma modulator.

In the foregoing example, the loop delay control circuit 5 is provided between the output terminal of the comparator 4 and the power switch stage 6. However, the loop delay control circuit 5 may be provided between the output terminal of the loop filter 3 and the input terminal of the comparator 4. Alternatively, the loop delay control circuit 5 may be provided in a part of a path of the loop filter 3. That is, the loop delay control circuit 5 may be provided in the loop of the delta-sigma modulator. However, required in the present embodiment, i.e., in cases where the loop filter is an analog circuit, is a loop delay control circuit for controlling a loop delay amount by which an analog signal is delayed. The loop delay control circuit 5, which forms a part of the loop of the delta-sigma modulator and which includes the delay elements, is provided in a part where the characteristic indicated by the solid line of each of FIGS. 3 and 4 is obtained. This makes it possible to realize a delta-sigma modulator which is free from a great deterioration in performance and which is capable of reducing the average switching rate.

In the foregoing example, only one loop delay control circuit is provided, namely the loop delay control circuit 5. However, a plurality of loop delay control circuits may be provided.

Second Embodiment

Another embodiment of the present invention will be described below with reference to FIGS. 12 to 18.

Figure 12:
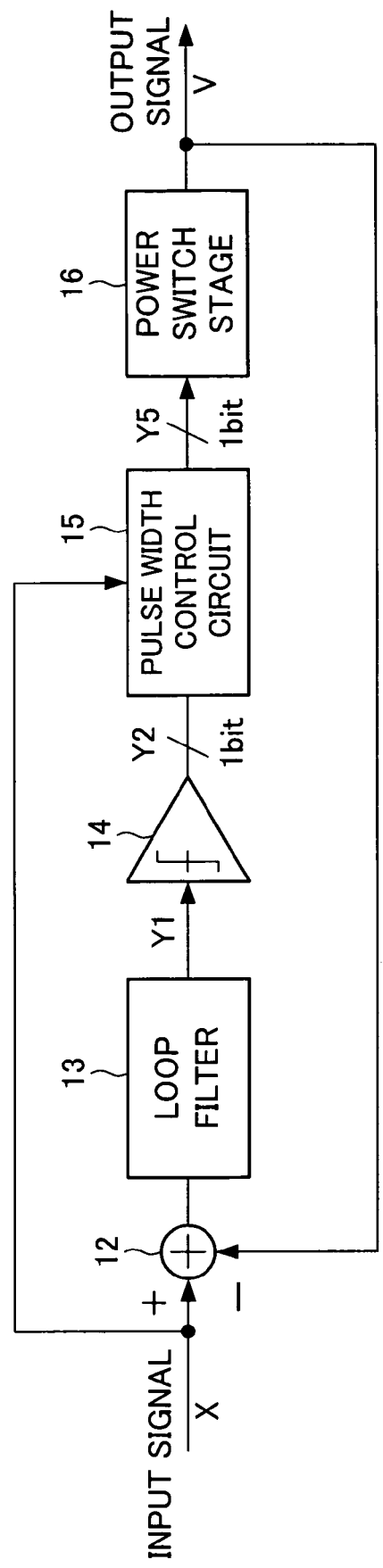
FIG. 12 is a block diagram illustrating an arrangement of a switching amplification circuit according to a second embodiment of the present invention.

FIG. 12 illustrates an arrangement of a switching amplification circuit 11 according to the present embodiment. The switching amplification circuit 11 includes a subtracter 12, a loop filter 13, a comparator 14, a pulse width control circuit 15, and a power switch stage 16. The subtracter 12 calculates a difference between (i) an input signal X supplied to the switching amplification circuit 11 and (ii) an output signal V supplied from the switching amplification circuit 11. The loop filter 13 integrates a signal supplied from the subtracter 12, and outputs the integrated signal as an output signal Y1. The comparator 14 converts the output signal Y1 of the loop filter 13 into a 1-bit signal, and outputs the 1-bit signal as an output signal Y2. The pulse width control circuit 15 changes, in accordance with the input signal X, a minimum pulse width of the output signal Y2 sent from the comparator 14, so as to output an output signal Y5. The power switch stage 16 amplifies the output signal Y5 sent from the pulse width control circuit 15, and transmits the amplified signal to a load as the output signal V. The output signal V is fed back to the loop filter 13 via the subtracter 12. The comparator 14 is a synchronous comparator that operates in synchronism with an external clock signal.

The loop filter 13 and the comparator 14 constitute a delta-sigma modulator. The delta-sigma modulator, the pulse width control circuit 15, and the power switch stage 16 are provided in a feedback path of the switching amplification circuit 11.

Figure 13:
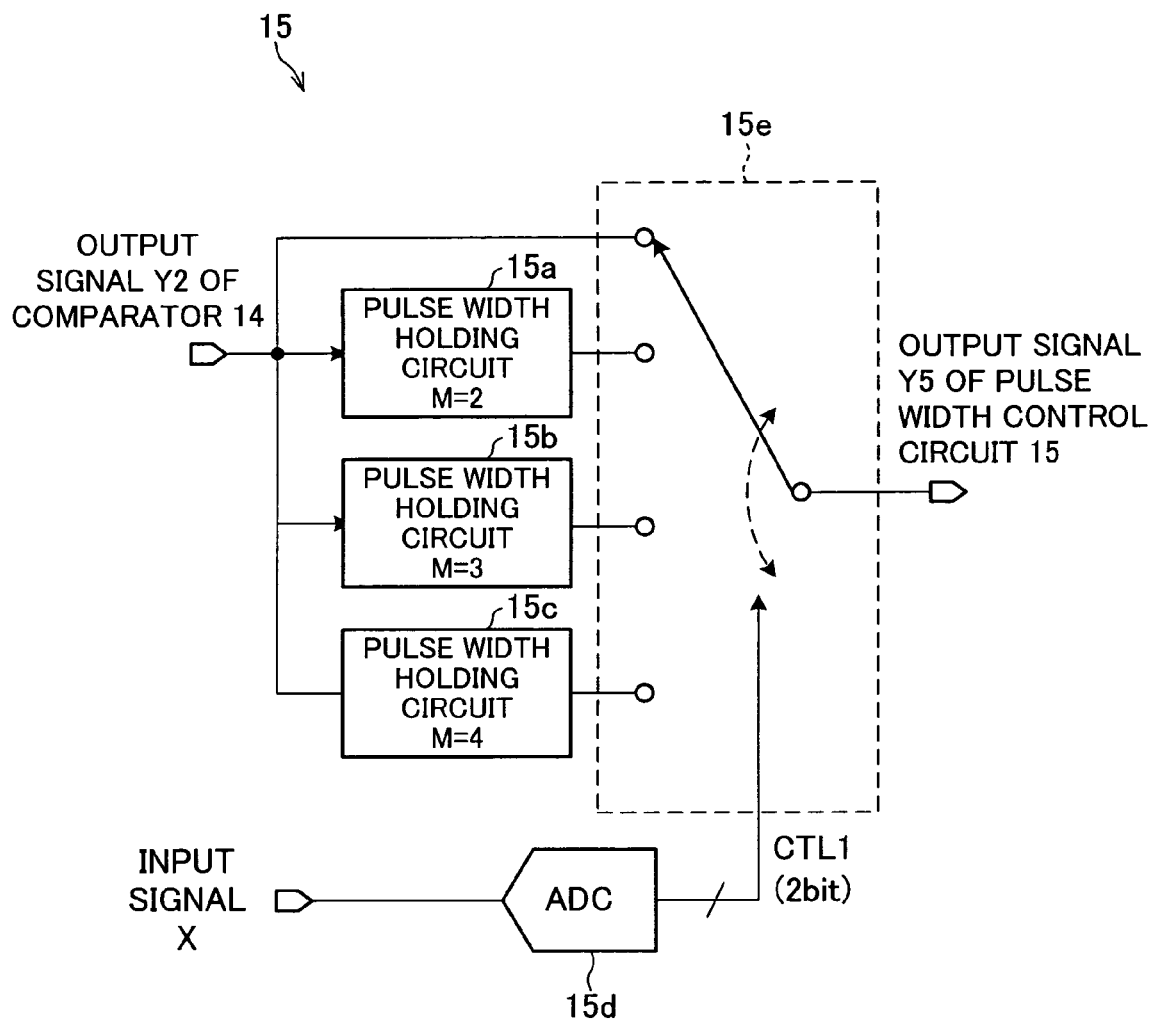
FIG. 13 is a circuit block diagram illustrating an arrangement of a pulse width control circuit of the switching amplification circuit of FIG. 12.

FIG. 13 illustrates an arrangement of the pulse width control circuit 15. It is assumed here that the loop filter 13 is arranged in the same manner as the loop filter 3 shown in FIG. 2. The pulse width control circuit 5 includes a plurality of pulse width holding circuits 15a, 15b, and 15c, an A/D converter 15d, and a pulse width selection circuit 15e. The pulse width holding circuits 15a, 15b, and 15c change the minimum pulse width of the output signal Y2 sent from the comparator 14. The A/D converter 15d serves as a quantizer that quantizes the amplitude of the input signal X and that outputs the quantized signal as a selection signal CTL1. The pulse width selection circuit 15e selects, in accordance with the selection signal CTL1 sent from the A/D converter 15d, any one of the output signal Y2 of the comparator 14 and respective output signals of the pulse width holding circuits 15a, 15b, and 15c, and sends the selected signal to the power switch stage 16. The pulse width holding circuits 15a, 15b and 15c receive the output signal Y2 sent from the comparator 14, and respectively output signals having different minimum pulse widths. That is, the pulse width holding circuits 15a, 15b, and 15c output signals having certain different minimum pulse widths or greater, respectively. Thus, the pulse width holding circuits 15a, 15b, and 15c constitute a minimum pulse width setting circuit. Here, the minimum pulse width setting circuit outputs four signals respectively having four minimum pulse widths, one of which is equal to that of the output signal Y2 sent from the comparator 14.

Figure 14:
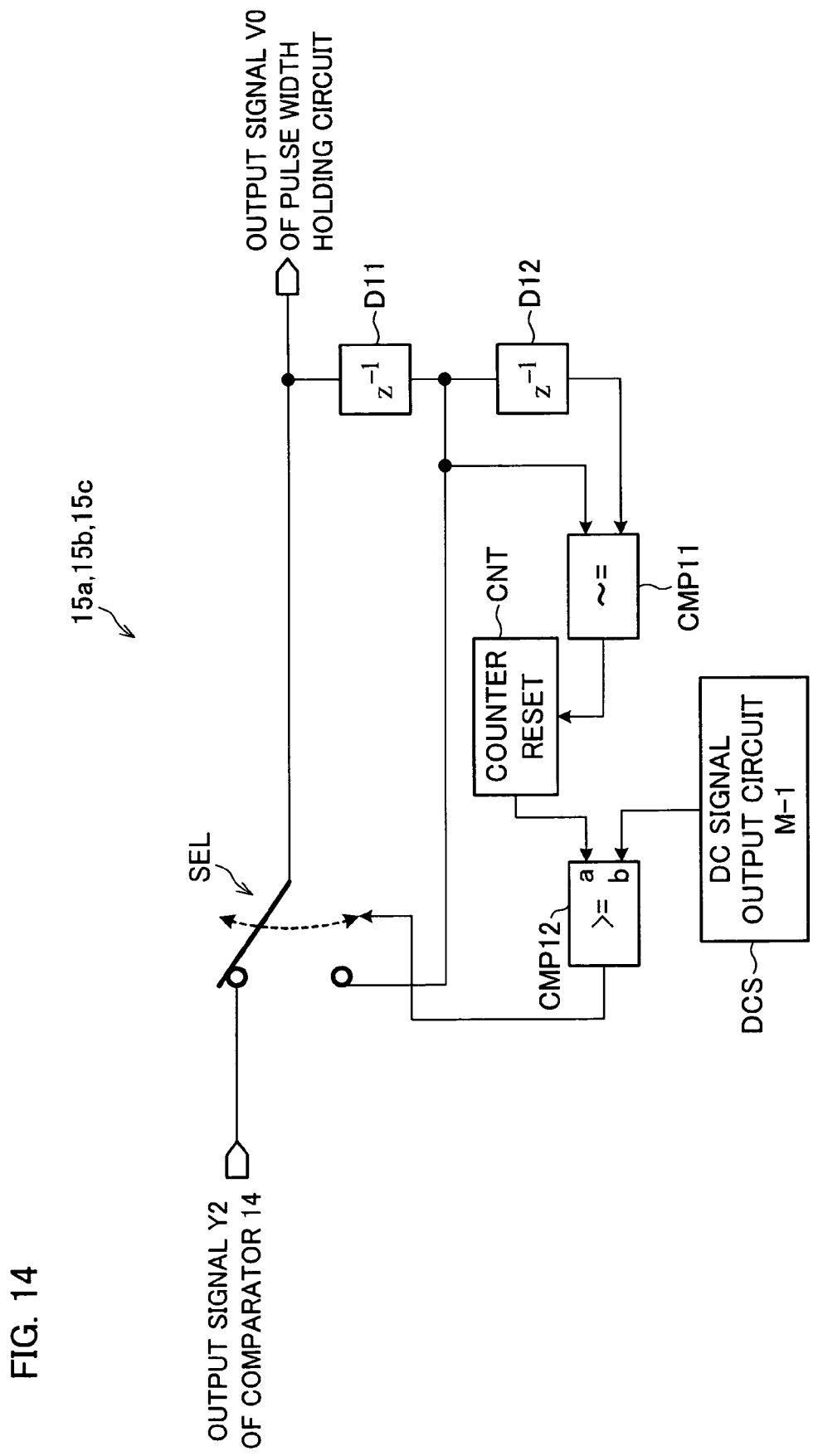
FIG. 14 is a circuit block diagram illustrating an arrangement of a pulse width holding circuit of the pulse width control circuit of FIG. 13.

FIG. 14 illustrates an arrangement of each of the pulse width holding circuits 15a, 15b, and 15c. The pulse width holding circuit includes a data selector SEL, two delay circuits D11 and D12, a comparator CMP11, a counter CNT, a DC signal output circuit DCS, and a comparator CMP12. The data selector SEL selects either the received signal (i.e., the output signal Y2 sent from the comparator 14) or a signal obtained by delaying an output signal VO of the pulse width holding circuit by one clock, so that the selected signal is outputted. The delay circuits D11 and D12 delay the output signal VO. The comparator CMP11 compares respective output values of the delay circuits D11 and D12. The counter CNT is reset upon receipt of an output sent from the comparator CMP11. The DC signal output circuit DCS sets the minimum pulse width. The comparator CMP12 compares respective output values of the counter CNT and the DC signal output circuit DCS.

The comparator CMP11 outputs a signal indicative of 1, when the respective output values of the delay circuits D11 and D12 are not equal. The comparator CMP11 outputs a signal indicative of 0, when the output values are equal. An output count value indicated by the counter CNT is reset to 0 when the comparator CMP11 outputs the signal indicative of 1. The output count, value indicated by the counter CNT is increased by 1 in synchronism with an external clock when the comparator CMP11 outputs the signal indicative of 0. Further, the DC signal output circuit DCS outputs a signal indicative of a value "M-1", where M indicates the minimum pulse width, and takes on values of 2, 3, and 4 respectively in the pulse width holding circuits 15a, 15b, and 15c. Further, when the output value of the counter CNT is equal to or greater than M-1, the comparator CMP12 outputs a signal indicative of 1, and when the condition is not satisfied, the comparator CMP12 outputs a signal indicative of 0. When the comparator CMP12 outputs the signal indicative of 1, the data selector SEL selects the output signal Y2 supplied from the comparator 14, with the result that the selected signal is outputted as the output signal VO of the pulse width holding circuit. When the comparator CMP 12 outputs the signal indicative of 0, the data selector SEL selects the output of the delay circuit D11, i.e., the signal obtained by delaying the output signal VO of the pulse width holding circuit by one clock, with the result that the selected signal is outputted as the output signal VO of the pulse width holding circuit. The circuit described above makes it possible to convert the input 1-bit signal into the signal having a minimum pulse width of M.

See FIG. 13. When the pulse width selection circuit 15e selects the output signal Y2, the output signal Y5 is a signal having a minimum pulse width of 1. When the pulse width selection circuit 15e selects the output signal sent from the pulse width holding circuit 15a, the output signal Y5 is a signal having a minimum width of 2. When the pulse width holding circuit 15e selects the output signal sent from the pulse width holding circuit 15b, the output signal Y5 is a signal having a minimum pulse width of 3. When the pulse width selection circuit 15e selects the output signal sent from the pulse width holding circuit 15c, the output signal Y5 is a signal having a minimum pulse width of 4.

Figure 15:
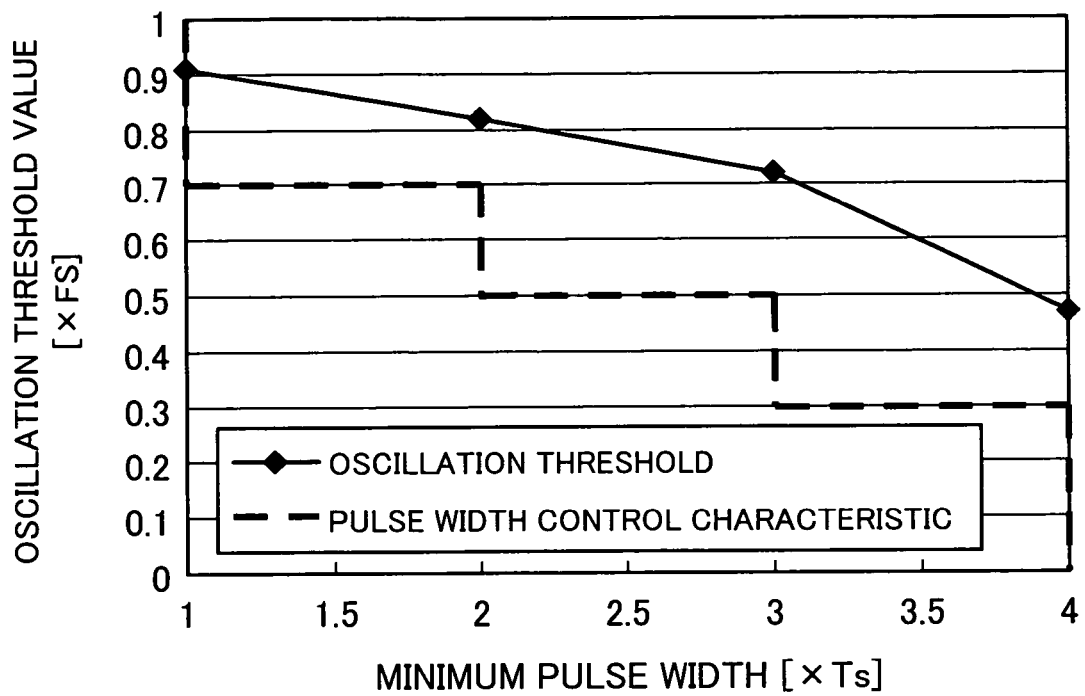
FIG. 15 is a graph showing an oscillation threshold value as a function of a minimum pulse width.
Figure 16:
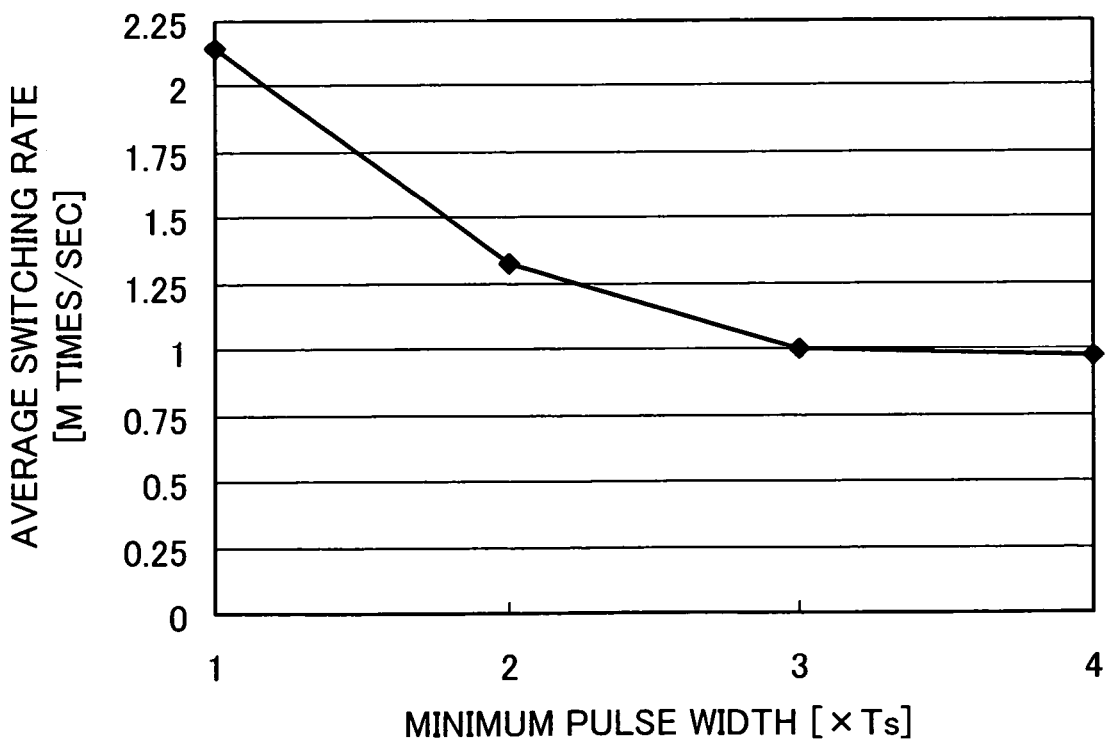
FIG. 16 is a graph showing the average switching rate as a function of the minimum pulse width.
Figure 19:
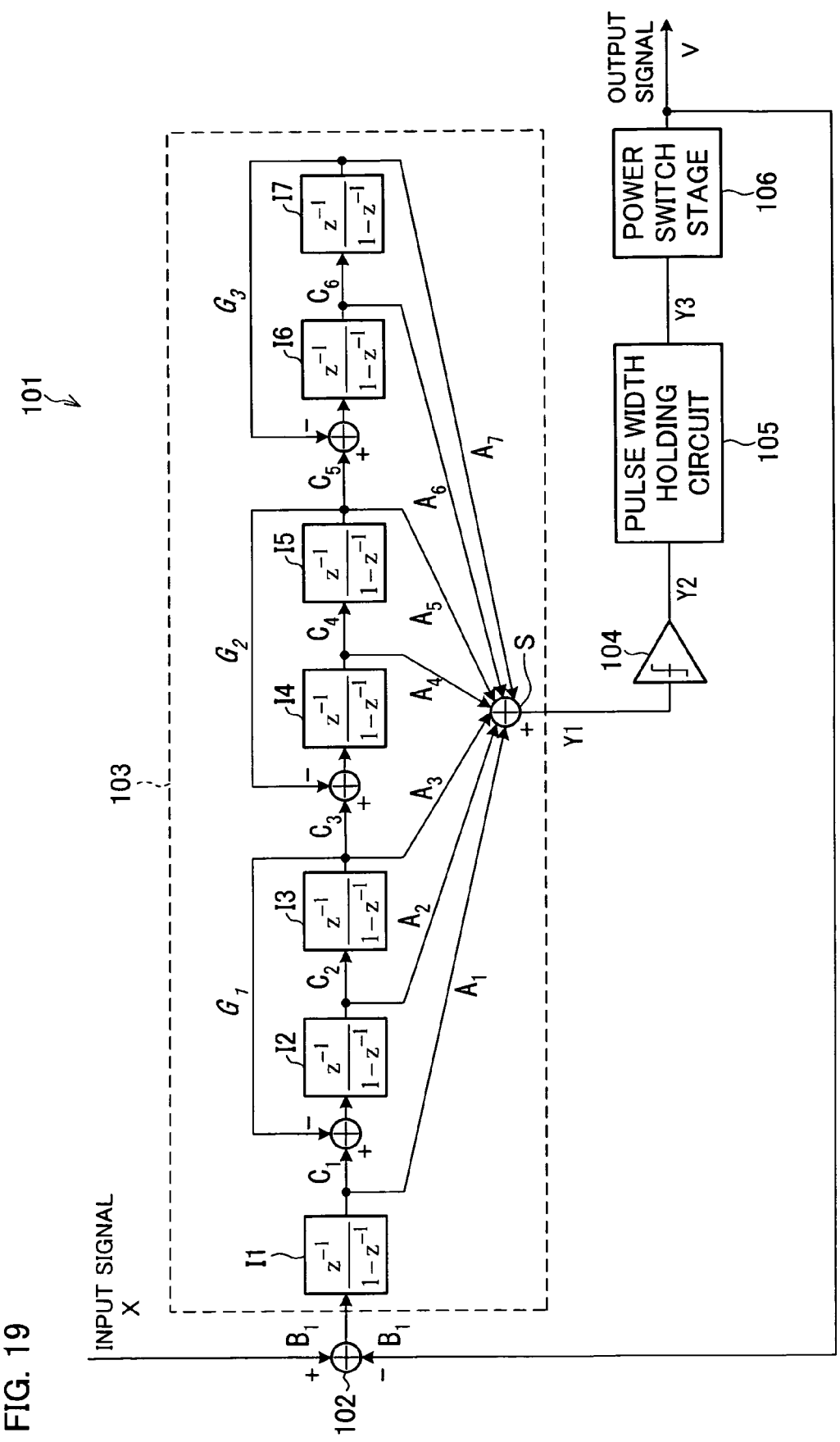
FIG. 19 is a circuit block diagram illustrating an arrangement of the conventional switching amplification circuit.

See FIG. 15 (the solid line) illustrating the oscillation threshold value characteristic, as a function of the minimum pulse width, of the switching amplification circuit 101 that is shown in FIG. 19 and that has the loop in which the pulse width holding circuit 105 is provided. The oscillation threshold value characteristic is obtained in cases where the signal to be sent from the pulse width holding circuit 105 is so set as to have a minimum pulse width of 1×Ts (the holding circuit 105 outputs the received signal without changing the minimum pulse width of the received signal), 2×Ts, 3×Ts, or 4×Ts. Also, see FIG. 16 illustrating the average switching rate characteristic in cases where the signal to be sent to the switching amplification circuit 101 has amplitude equal to the oscillation threshold value. Further, the dotted line of FIG. 15 indicates a pulse width control characteristic of the pulse width control circuit described later. The oscillation threshold value characteristic shown in FIG. 15 clarifies that the oscillation threshold value gradually decreases as the minimum pulse width increases. Further, FIG. 16 clarifies that the average switching rate decreases as the minimum pulse width increases.

These results show that: by controlling the minimum pulse width in accordance with the value of the input signal X, a switching amplification circuit can be realized which (i) does not reduce the oscillation threshold value, (ii) has a low average switching rate, and (iii) is free from a great deterioration in the dynamic range, as compared with the conventional switching amplification circuit. In light of this, as illustrated in FIGS. 12 and 13, the present embodiment includes the pulse width control circuit 15.

The pulse width control circuit 15 controls, in accordance with the input signal X, the minimum pulse width of the output signal Y2 of the comparator 14. Therefore, when the absolute value of the input signal X is especially high, the pulse width control circuit 15 carries out such control that the output signal V has a narrow minimum pulse width. When the absolute value of the input signal X is not so high, the pulse width control circuit 15 carries out such control that the output signal V has a great minimum pulse width. With this, the average switching rate of the output signal V can be greatly reduced, but the oscillation threshold value is not reduced. Such a delta-sigma modulator and the switching amplification circuit 11 make it possible to realize both (i) such a high oscillation threshold value, i.e., high output power, and (ii) high power efficiency.

Figure 17:
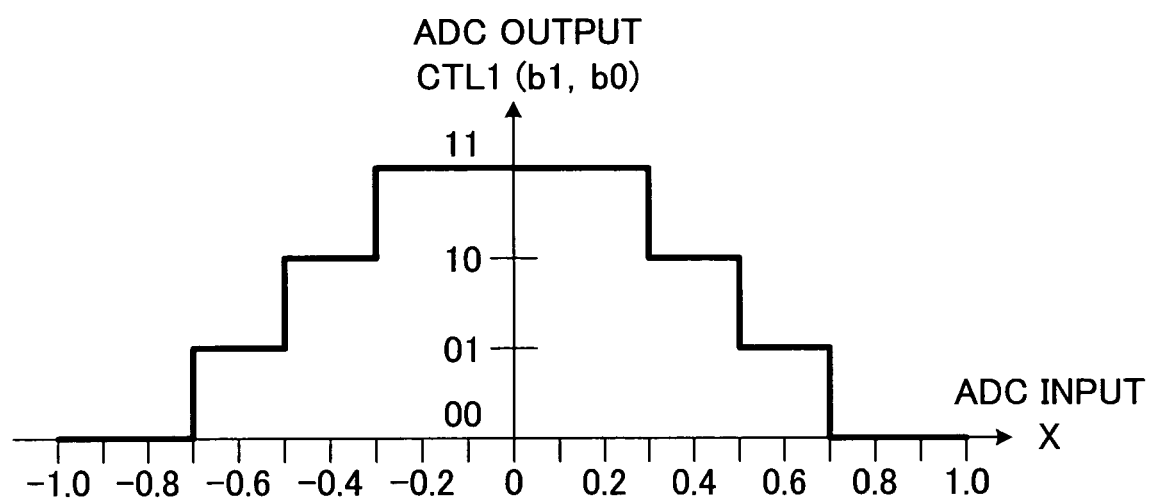
FIG. 17 is a graph showing the relationship between (i) an input of an A/D converter of the pulse width control circuit of FIG. 13, and (ii) an output thereof.

Because the pulse width control circuit 15 is basically controlled in the same manner as the loop delay control circuit of the first embodiment, only the differences will be described below. FIG. 17 shows an input-output characteristic of the A/D converter 15d shown in FIG. 13. In cases where the absolute value of the value of the input signal X falls within a range from 0 to 0.3, the A/D converter 15d outputs the selection signal CTL1 indicative of 11. In cases where the absolute value of the value of the input signal X falls within a range from 0.3 to 0.5, the A/D converter 15*d* outputs the selection signal CTL1 indicative of 10. In cases where the absolute value of the value of the input signal X falls within a range from 0.5 to 0.7, the A/D converter 15*d* outputs the selection signal CTL1 indicative of 01. In cases where the absolute value of the value of the input signal X is greater than 0.7, the A/D converter 15*d* outputs the selection signal CTL1 indicative of 00. The selection signal CTL1 is sent from the A/D converter 15*d* to the pulse width selection circuit 15*e* of FIG. 13 such that the following controls (1) through (4) are carried out: (1) a terminal outputting the output signal Y5 is connected to an output terminal of the pulse width holding circuit (M=4) 15*c* when the selection signal CTL1 is indicative of 11; (2) the terminal outputting the output signal Y5 is connected to an output terminal of the pulse width holding circuit (M=3) 15*b* when the selection signal CTL1 is indicative of 10; (3) the terminal outputting the output signal Y5 is connected to an output terminal of the pulse width holding circuit (M=2) 15*a* when the selection signal CTL1 is indicative of 01; (4) the terminal outputting the output signal Y5 is connected to an input terminal receiving the output signal Y2, when the selection signal CTL1 is indicative of 00. As such, the pulse width control circuit 15 can be realized with ease.

This allows realization of a delta-sigma modulator which slightly suffers from distortion and deterioration in the dynamic range but which is capable of greatly reducing the average switching rate in accordance with the above operation.

The pulse width control circuit 15 is limited to the four selectable minimum pulse widths of 1, 2, 3, and 4. However, in cases where the duty ratio of (i) a pulse width between a rising edge and a falling edge of a control clock signal to (ii) a pulse width between the falling edge and the next rising edge is 50:50, it becomes possible to select any one of signals respectively having minimum pulse widths of 1, 1.5, 2, 2.5, and so forth. Generally, there may be a plurality of minimum pulse widths, one of which may be or may not be equal to that of the output signal Y2 sent from the comparator 14. Further, the pulse width control circuit 15 is disposed between an output terminal of the comparator 14 and an input terminal of the power switch stage 16, but may be disposed between the output terminal of the power switch stage 16 and an input terminal of the subtracter 12. However, the pulse width control circuit 15 is preferably disposed between the comparator 14 and the power switch stage 16.

Further, the pulse width control circuit 15 controls the minimum pulse width by selecting any one of the output signals sent respectively from the plurality of pulse width holding circuits connected in parallel to one another. However, the minimum pulse width can be similarly controlled, for example, by changing the value (M−1) of the DC output signal with the use of a single pulse width holding circuit.

This is the end of the description of the first and second embodiments.

Each of the first and second embodiments assumes that the input signal X is an analog signal, and that the subtracter 2 or 12, the loop filter 3 or 13, and the comparator 4 or 14 are realized using analog circuits, respectively. Moreover, the power switch stage 6 or 16 feeds back, to the loop filter 3 or 13, the output signal V which is an analog signal. This makes it possible to obtain a noise-shaping characteristic for shaping the noise and distortion each introduced by the power switch stage 6 or 16. Alternatively, however, the output signal Y4 of the loop delay control circuit 5 or the output signal Y5 of the pulse width signal control circuit 15 may be fed back to the loop filter 3 or 13. In this case, because the output signal Y4 of the loop delay control circuit 5 or the output signal Y5 of the pulse width signal control circuit 15 is a digital signal, the subtracter 2 or 12 and the loop filter 3 or 13 may be digital circuits, respectively. In this case, the input signal X can be a digital signal. When the loop filter 3 or 13 and the comparator 4 or 14 are respectively the digital circuits as such, the delta-sigma modulator is entirely the digital circuits. Accordingly, the input signal X can be a digital signal, and therefore can be subjected directly to digital processing.

In cases where the input signal X is a digital signal as such, the delay amount or the minimum pulse width is controlled in accordance with the amplitude of the input signal X.

Further, each of the first and second embodiments describes the switching amplification circuit. However, the feature of the present invention lies in that the arrangement of the delta-sigma modulator allowing reduction of the average switching rate. Therefore, the switching amplification circuit is not only one in which the delta-sigma modulator is provided.

Further, each of the first and second embodiments assumes that the delta-sigma modulator is a feed-forward type (which adds respective outputs of integrators in a weighting manner). However, the delta-sigma modulator may be a distributed feedback type, which feeds the output signal V back to respective input terminals of the integrators. That is, the delta-sigma modulator only needs to have the noise-shaping characteristic.

Further, each of the first and second embodiments does not fully describe the circuits of the delta-sigma modulator and the power switch stage. However, the circuits of the delta-sigma modulator and the power switch stage have already been disclosed in a large number of documents, and therefore can be realized by any analog-digital circuit designer. For example, a delta-sigma modulator circuit technique for an A/D converter is disclosed in Non-patent Document 3 ("A monolithic 20-b delta-sigma A/D converter", *IEEE Journal of Solid-State Circuits*, Vol. 25, No. 6, December 1990). Furthermore, a switching amplification circuit using a delta-sigma modulator is disclosed in detail in Non-patent Documents 4 ("A low-voltage fully-monolithic delta-sigma-based class-D audio amplifier", 29th European Solid-State Circuits Conference, September 2003) and 5 ("12V Σ-Δ class-D amplifier in 5V CMOS technology", IEEE Custom Integrated Conference, 1995).

Further, the loop filter 3 shown in FIG. 2 includes the one continuous-time integrator and the six discrete-time integrators, and is arranged such that the input signal X and the output signal V are supplied to the continuous-time integrator. Such a loop filter prevents the wideband continuous-time signals (noise and distortion) introduced by the power switch stage 6, from aliasing (folding) back to the desired signal band when the loop filter samples the signals. This makes it possible to obtain the noise-shaping characteristic for the wideband noise and distortion.

Figure 18:
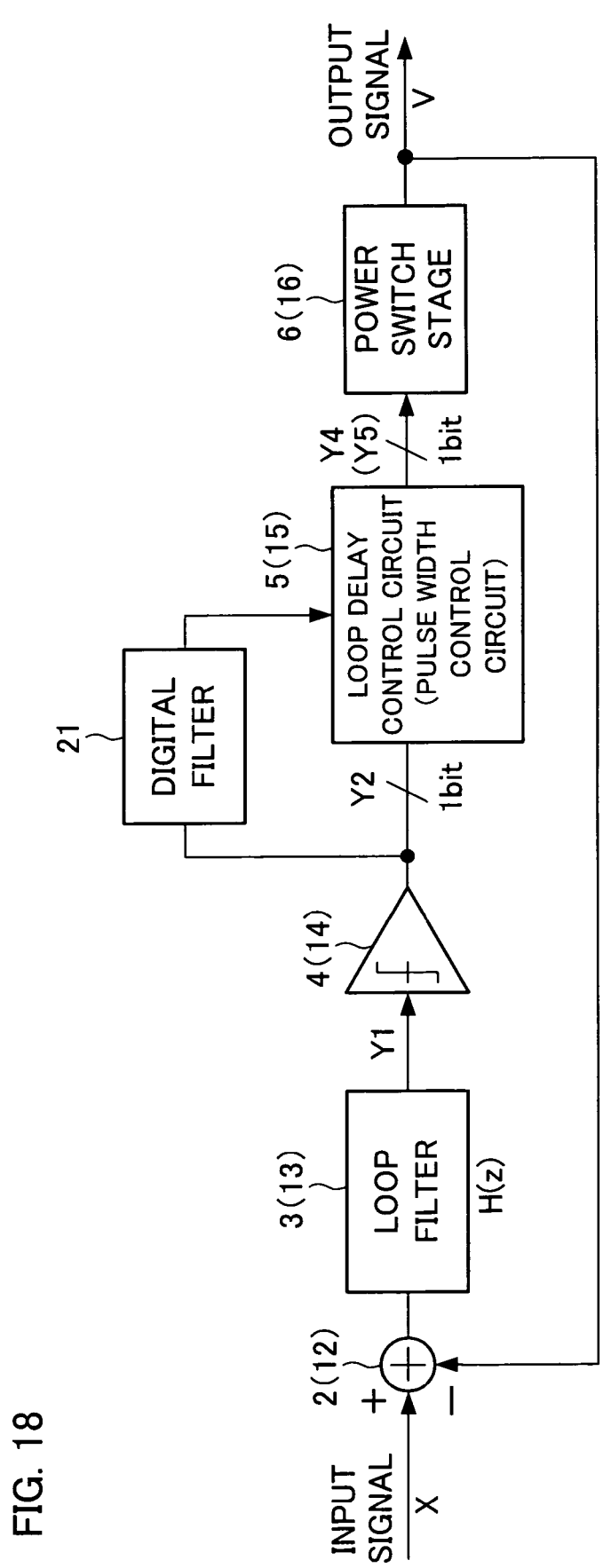
FIG. 18 is a block diagram illustrating an arrangement of a modified example of the switching amplification circuits of FIGS. 1 and 12.

Further, each of the first and second embodiments assumes that the selection signal CTL1 of either the loop delay control circuit 5 or the pulse width control circuit 15 is generated in accordance with the input signal X to be sent to the switching amplification circuit 1 or 11. However, the selection signal CTL1 may be an internal signal of the delta-sigma modulator, and may be a signal containing a component of the input signal X. For example, as illustrated in FIG. 18, the output signal Y2 sent from the comparator 4 or 14 may be used as the signal for controlling either the loop delay control circuit 5 or the pulse width control circuit 15.

The output signal Y2 sent from the comparator 4 or 14 is represented as a sum of (i) the input signal X, (ii) noise (EQ) introduced by the comparator 4 or 14, and (iii) noise (ESW) introduced by the power switch stage 6 or 16. Specifically, the output signal Y2 is represented by the following formula:

$$Y_2 = \frac{H(z)}{1+H(z)} \cdot X + \frac{1}{1+H(z)} \cdot E_Q - \frac{H(z)}{1+H(z)} \cdot E_{SW}$$

where H(z) is the transfer characteristic of the loop filter 3 or 13.

Therefore, as illustrated in FIG. 18, a function similar to those of the first and second embodiments can be realized by using a digital filter 21 such that the EQ component and the ESW component contained in the output signal sent from the comparator 4 or 14 are so filtered as to be removed. Although FIG. 18 assumes that the output signal Y2 sent from the comparator 4 or 14 is selected as the signal for controlling the loop delay control circuit 5 or the pulse width control circuit 15, the control signal may be the signal sent to the comparator 4 or 14. Further, the same functions can be realized even when the output signal V sent from the power switch stage 6 or 16 is used. The arrangement of FIG. 18 makes it possible that the digital filter 21 and either the loop delay control circuit 5 or the pulse width control circuit 15(see FIG. 18) can be entirely digital circuits even when the delta-sigma modulator is an analog circuit. This offers an advantage of facilitating designing.

The present invention is not limited to the description of the embodiments above, but may be altered by a skilled person within the scope of the claims. An embodiment based on a proper combination of technical means disclosed in different embodiments is encompassed in the technical scope of the present invention.

The delta-sigma modulator of the present embodiment is preferably arranged such that each of the loop delay control circuits includes (i) a quantizer for quantizing the input signal; (ii) a delay causing circuit for setting a plurality of loop delay amounts so that a plurality of signals are obtained by delaying, by the loop delay amounts, a signal sent to the loop delay control circuit, and for outputting the signals; and (iii) a loop delay selection circuit for selecting, in accordance with an output value of the quantizer, any one of the signals sent from the delay causing circuit, and for outputting the selected signal as an output signal of the loop delay control circuit.

The foregoing arrangement makes it possible to easily realize the loop delay control circuit.

The delta-sigma modulator of the present embodiment is preferably arranged such that the delay amount is an integral multiple of either (i) Ts, which is a basic operating cycle of the delta-sigma modulator, or (ii) Ts/2.

The foregoing arrangement makes it possible to delay a signal in accordance with an operation of the delta-sigma modulator. The loop delay amount can be set by combining a plurality of flip-flops that operate in response to rising and falling edges of an operation clock signal of the delta-sigma modulator. This makes it possible to further simplify the circuit structure.

The delta-sigma modulator of the present embodiment is preferably arranged such that the pulse width control circuit includes (i) a quantizer for quantizing the input signal; (ii) a minimum pulse width setting circuit for carrying out setting so that a plurality of signals having different minimum pulse widths are obtained in accordance with a signal sent to the pulse width control circuit, and for outputting the signals; and (iii) a pulse width selection circuit for selecting, in accordance with an output value of the quantizer, any one of the signals sent from the minimum pulse width setting circuit, and for outputting the selected signal as an output signal of the loop delay control circuit.

The foregoing arrangement makes it possible to easily realize the pulse width control circuit.

The delta-sigma modulator of the present embodiment is preferably a digital circuit.

With the foregoing arrangement, the input signal can be a digital signal, and therefore can be subjected directly to digital processing.

The delta-sigma modulator of the present embodiment is preferably arranged such that: the loop filter and the comparator are analog circuits, respectively; and the input signal sent to the delta-sigma modulator is an analog signal.

With the foregoing arrangement, the analog input signal can be subjected to delta-sigma modulation such that high output power and high power efficiency are realized.

The delta-sigma modulator of the present embodiment is preferably arranged such that the loop filter includes: (i) one or more integrators; and (ii) a gain stage for amplifying or attenuating either (a) a signal sent to each of the integrators, or (b) a signal sent from the integrator.

With the foregoing arrangement, the signal sent to each of the integrators can be subjected to noise shaping with the use of the loop filter and the comparator.

The switching amplification circuit of the present embodiment is preferably arranged such that the loop filter includes (i) one or more continuous-time integrators; and (ii) one or more discrete-time integrators.

With the foregoing arrangement, the loop filter samples continuous-time and wideband noise and distortion each introduced by the power switch stage, so that folding noise and folding distortion are not generated in the desired band. This makes it possible to obtain the noise-shaping characteristic for the wideband noise and distortion.

The delta-sigma modulator of the present embodiment is preferably arranged such that the loop delay control circuit is provided immediately after the comparator.

The delta-sigma modulator of the present embodiment is preferably arranged such that the loop delay control circuit is provided between the loop filter and the comparator.

The delta-sigma modulator of the present embodiment is preferably arranged such that the pulse width control circuit is provided immediately after the comparator.

The present invention can be applied suitably to a switching amplification circuit of a class-D amplifier.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A delta-sigma modulator, comprising:
   a loop filter;
   a comparator; and
   one or more loop delay control circuits, each of which is provided in a loop of the delta-sigma modulator, and each of which controls a loop delay amount by which a signal is delayed, each of the loop delay control circuits controlling the loop delay amount in accordance with either (i) a value of the input signal sent to the delta-sigma modulator, or (ii) a value of a signal containing a component of the input signal, and the loop delay amount being set to be large when an amplitude of the input signal is small, and the loop delay amount being set to be small when the amplitude of the input signal is large.

2. The delta-sigma modulator as set forth in claim 1 being a digital circuit.

3. The delta-sigma modulator as set forth in claim 1, wherein:

the loop filter and the comparator are analog circuits, respectively; and the input signal sent to the delta-sigma modulator is an analog signal.

4. The delta-sigma modulator as set forth in claim 1, wherein:

the loop filter includes: (i) one or more integrators; and (ii) a gain stage for amplifying or attenuating either (a) a signal sent to each of the integrators, or (b) a signal sent from the integrator.

5. A switching amplification circuit, comprising: the delta-sigma modulator as set forth in claim 1, the delta-sigma modulator having an output terminal connected to an input terminal of a power switch stage, electric power being supplied from the output terminal of the power switch stage to a load.

6. A switching amplification circuit, comprising: the delta-sigma modulator as set forth in claim 1, the delta-sigma modulator having a loop including a power switch stage, electric power being supplied from an output terminal of the power switch stage to a load.

7. The switching amplification circuit as set forth in claim 6, wherein:

the loop filter includes (i) one or more continuous-time integrators; and (ii) one or more discrete-time integrators.

8. The delta-sigma modulator as set forth in claim 1, wherein: the loop delay control circuit is provided between the comparator and a power switch stage.

9. The delta-sigma modulator as set forth in claim 1, wherein: the loop delay control circuit is provided between the loop filter and the comparator.

10. A delta-sigma modulator, comprising:

a loop filter;

a comparator; and a pulse width control circuit, which is provided in a loop of the delta-sigma modulator, and which controls a minimum pulse width of a signal quantized by the comparator, the pulse width control circuit including one or more minimum pulse width setting circuits each of which holds an input signal sent to the pulse width control circuit for a certain period or more and then outputs the input signal so that the pulse width control circuit controls the minimum pulse width in accordance with either (i) a value of an input signal sent to the delta-sigma modulator, or (ii) a value of a signal containing a component of the input signal.

11. The delta-sigma modulator as set forth in claim 10, wherein: the pulse width control circuit is provided between the comparator and a power switch stage.

12. A delta-sigma modulators, comprising:

a loop filter;

a comparator; and one or more loop delay control circuits, each of which is provided in a loop of the delta-sigma modulator, and each of which controls a loop delay amount by which a signal is delayed, each of the loop delay control circuits controlling the loop delay amount in accordance with either (i) a value of an input signal sent to the delta-sigma modulator, or (ii) a value of a signal containing a component of the input signal, wherein:

each of the loop delay control circuits includes (i) a quantizer for quantizing the input signal; (ii) a delay causing circuit for setting a plurality of loop delay amounts so that a plurality of signals are obtained by delaying, by the loop delay amounts, a signal sent to the loop delay control circuit, and for outputting the signals; and (iii) a loop delay selection circuit for selecting, in accordance with an output value of the quantizer, any one of the signals sent from the delay causing circuit, and for outputting the selected signal as an output signal of the loop delay control circuit.

13. The delta-sigma modulator as set forth in claim 12, wherein: the loop delay amount is an integral multiple of either (i) Ts, which is a basic operating cycle of the delta-sigma modulator, or (ii) Ts/2.

14. A delta-sigma modulator, comprising:

a loop filter;

a comparator; and a pulse width control circuit, which is provided in a loop of the delta-sigma modulator, and which controls a minimum pulse width of a signal quantized by the comparator, the pulse width control circuit controlling the minimum pulse width in accordance with either (i) a value of an input signal sent to the delta-sigma modulator, or (ii) a value of a signal containing a component of the input signal, wherein:

the pulse width control circuit includes (i) a quantizer for quantizing the input signal; (ii) a minimum pulse width setting circuit for carrying out setting so that a plurality of signals having different minimum pulse widths are obtained in accordance with a signal sent to the pulse width control circuit, and for outputting the signals; and (iii) a pulse width selection circuit for selecting, in accordance with an output value of the quantizer, any one of the signals sent from the minimum pulse width setting circuit, and for outputting the selected signal as an output signal of the pulse width control circuit.

* * * * *